(12) United States Patent
Lu et al.

(10) Patent No.: US 11,282,729 B2
(45) Date of Patent: Mar. 22, 2022

(54) METHOD AND APPARATUS FOR POLING POLYMER THIN FILMS

(71) Applicant: Areesys Technologies, Inc., Fremont, CA (US)

(72) Inventors: Hongwei Lu, Jiaxing (CN); Daliang Wang, Jiaxing (CN); Albert Ting, San Jose, CA (US); Efrain Velazquez, Tracy, CA (US); Xiaoyan Zhang, Jiaxing (CN); Kai-An Wang, Cupertino, CA (US)

(73) Assignee: Areesys Technologies, Inc., Fremont, CA (US)

( * ) Notice: Subject to any disclaimer, the term of this patent is extended or adjusted under 35 U.S.C. 154(b) by 159 days.

(21) Appl. No.: 16/728,472

(22) Filed: Dec. 27, 2019

(65) Prior Publication Data
US 2020/0211878 A1 Jul. 2, 2020

Related U.S. Application Data

(60) Provisional application No. 62/785,665, filed on Dec. 27, 2018.

(30) Foreign Application Priority Data

Apr. 17, 2019 (CN) .......................... 201910308554.0
Apr. 17, 2019 (CN) .......................... 201910308956.0
(Continued)

(51) Int. Cl.
*C08L 27/16* (2006.01)
*H01L 21/677* (2006.01)
*H01L 29/08* (2006.01)

(52) U.S. Cl.
CPC ........ *H01L 21/67703* (2013.01); *H01L 29/08* (2013.01); *C08L 27/16* (2013.01)

(58) Field of Classification Search
CPC .......... H01J 37/32715; H01J 37/32568; H01L 29/08; H01L 21/67703; C08L 27/16
See application file for complete search history.

(56) References Cited

U.S. PATENT DOCUMENTS

| 2013/0153813 | A1 | 6/2013 | Honda et al. | |
| 2018/0012784 | A1* | 1/2018 | Eto | .... H01L 21/3065 |
| 2018/0198055 | A1* | 7/2018 | Zhong | .... H01L 41/053 |

* cited by examiner

Primary Examiner — Seahvosh Nikmanesh
(74) Attorney, Agent, or Firm — Chen Yoshimura LLP

(57) ABSTRACT

A poling apparatus for poling a polymer thin film formed on a workpiece carried by a workpiece carrier. The workpiece has grounding electrodes and grounding pads located at edges, and a thin film covering the grounding electrodes but exposing the grounding pads. The workpiece carrier has carrier electrodes located around the workpiece and inside grounding ports at the bottom. The poling apparatus includes, in a poling chamber, a poling source generating a plasma, a Z-elevator to raise the workpiece carrier toward the poling source using the grounding ports, and grounding mechanisms including downwardly biased electrical contacts which, when the workpiece carrier is raised by the Z-elevator, connect the grounding pads of the workpiece with the carrier electrodes, to ground the workpiece. The poling apparatus additionally includes preparation platform and transfer platform with conveyer systems with rollers and Z-elevators to move the workpiece carrier in and out of the poling chamber.

13 Claims, 16 Drawing Sheets

(30) Foreign Application Priority Data

| Apr. 17, 2019 | (CN) | .......................... | 201910308975.3 |
| Apr. 17, 2019 | (CN) | .......................... | 201920521155.8 |
| Apr. 17, 2019 | (CN) | .......................... | 201920521158.1 |
| Apr. 17, 2019 | (CN) | .......................... | 201920521676.3 |

METHOD AND APPARATUS FOR POLING POLYMER THIN FILMS

BACKGROUND OF THE INVENTION

Field of the Invention

The embodiment of this disclosure relates to a poling technology that polarizes polymer thin films and, in particular, relates to a poling chamber, a work piece used with the poling chamber, and related poling methods.

Description of Related Art

After crystallization by annealing, materials like PVDF (polyvinylidene difluoride) and their co-polymers (PVDF-TrFE, for example) need to be polarized (or poled) in order to re-align their randomly oriented molecular electrical dipoles along certain desired direction. This polarization or poling process transforms the polymer materials to possess certain electroactive properties. They may include piezoelectric, pyroelectric or others desired properties. It is these properties that form the foundations for many polymer-based transducers, sensors, actuators and memories.

To carry out the poling process for the polymer thin film, a fairly strong electric field is established, for instance, perpendicular to the surfaces of the thin film. The electric field may be created by applying high voltages across conductive electrodes deposited on the two opposite surfaces of the thin film (see FIG. 9). This method is referred to as direct poling. In another method called plasma poling, the electric field is induced by a layer of dense electric charge which is dynamically formed by like charged species (e.g., electrons, negative ions) out of a plasma that is generated by ionized gas inside a closed chamber.

The polarization of the film is a significant part of the processing of thin-film materials. The goal is to re-align randomly oriented molecular electrical dipoles within a polymer thin film along the desired direction (such as the direction of the applied poling field). This polarization or poling process transforms the polymer materials to possess specific electro-active properties. The poling process of the polymer thin films is slow as it can only polarize one polymer thin film at a time. Accordingly, there is a need in technology for providing a fast poling process.

SUMMARY

Plasma poling apparatus can polarize electrical dipoles and displace other electrically charged constituents (electrons, ions, etc.) inside polymer materials to transform those materials into electroactive ones. Embodiments of this invention provide a method and associated apparatus to implement mass production process for plasma poling of polymer thin films over large area workpiece. The plasma poling method and apparatus are applicable to fabrication of electroactive polymer-based sensors, actuators, transducers, memory devices, touch control panels, active cooling devices, as well as electric energy storage devices. For higher speed, more uniform and higher yield poling process, embodiments of this invention provide a grounding method designed in the apparatus. A modularized and arrayed approach is also disclosed for constructing large area poling sources, which are key for large area poling apparatus to achieve uniform and damage-free process.

The embodiments of the present disclosure provides a type of poling chamber to achieve the fast polarization of polymer thin films. Various embodiments and aspects of present invention provide a poling chamber, a carrier platform, and a workpiece for poling polymer thin film, and related methods.

In a first aspect, the embodiment of the present disclosure provides a type of workpiece. The workpiece includes the substrate and the polymer thin film that is formed on the substrate. The substrate includes a base plate, grounding electrodes, and grounding pads. The grounding pads and electrodes are placed on the same surface of the base plate. The grounding electrodes are covered by the polymer thin film, while the grounding pads remain exposed. The grounding pads are at the edges of the base plate. There are multiple grounding electrodes. The grounding electrodes are spaced apart on the base plate.

In a second aspect, the embodiment of the present disclosure provides a type of carrier platform. The carrier platform is used to carry the workpiece, as described in the first aspect. The carrier platform is presented as a flat plate and has a substrate carrying recess. The base of the substrate carrying recess has at least two jacking holes that run through the thickness of the carrier platform. On the surface of the carrier platform opposite to the substrate carrying recess, there are grounding ports. The carrier platform also includes carrier electrodes with at least some of the carrier electrodes placed at the bottom of the grounding ports and some at the sides of the substrate carrying recess.

In a third aspect, the embodiment of the present disclosure provides a type of poling chamber. The poling chamber is used to polarize the workpiece on the carrier platform, as stated in the second aspect. The poling chamber includes a second Z-elevator and cover. The cover includes a conductive pad. The second Z-elevator includes a grounding wire. The second Z-elevator is situated below the cover. When the carrier platform and the workpiece on the carrier platform are at the preset second position, the second Z-elevator moves up to push the carrier platform up to come into contact with the cover. The cover exposes the polymer thin film on the carrier platform. The conductive pad of the cover becomes electrically connected with the grounding pads of the workpiece and the carrier electrodes of the carrier platform, simultaneously. The grounding wires of the second Z-elevator come into contact with the carrier electrodes of the carrier platform.

Compared with existing technology, the embodiment of the present disclosure allows polarized polymer thin films to be cut into small pieces of polarized film, increasing the production efficiency of small size polarized polymer thin films. Such poling is achieved through a method and set up, including a workpiece, a carrier platform, and a poling chamber. The workpiece includes the substrate and the polymer thin film formed on the substrate. The substrate includes a base plate, grounding electrodes, and grounding pads. The grounding pads are at the edges of the base plate. There may be multiple grounding electrodes. The grounding electrodes are aligned in an array. The grounding pads and electrodes are on the same surface. The grounding electrodes are covered by the polymer thin film, while the grounding pads remain exposed.

DETAILED DESCRIPTION OF PREFERRED EMBODIMENTS

Figure 1:
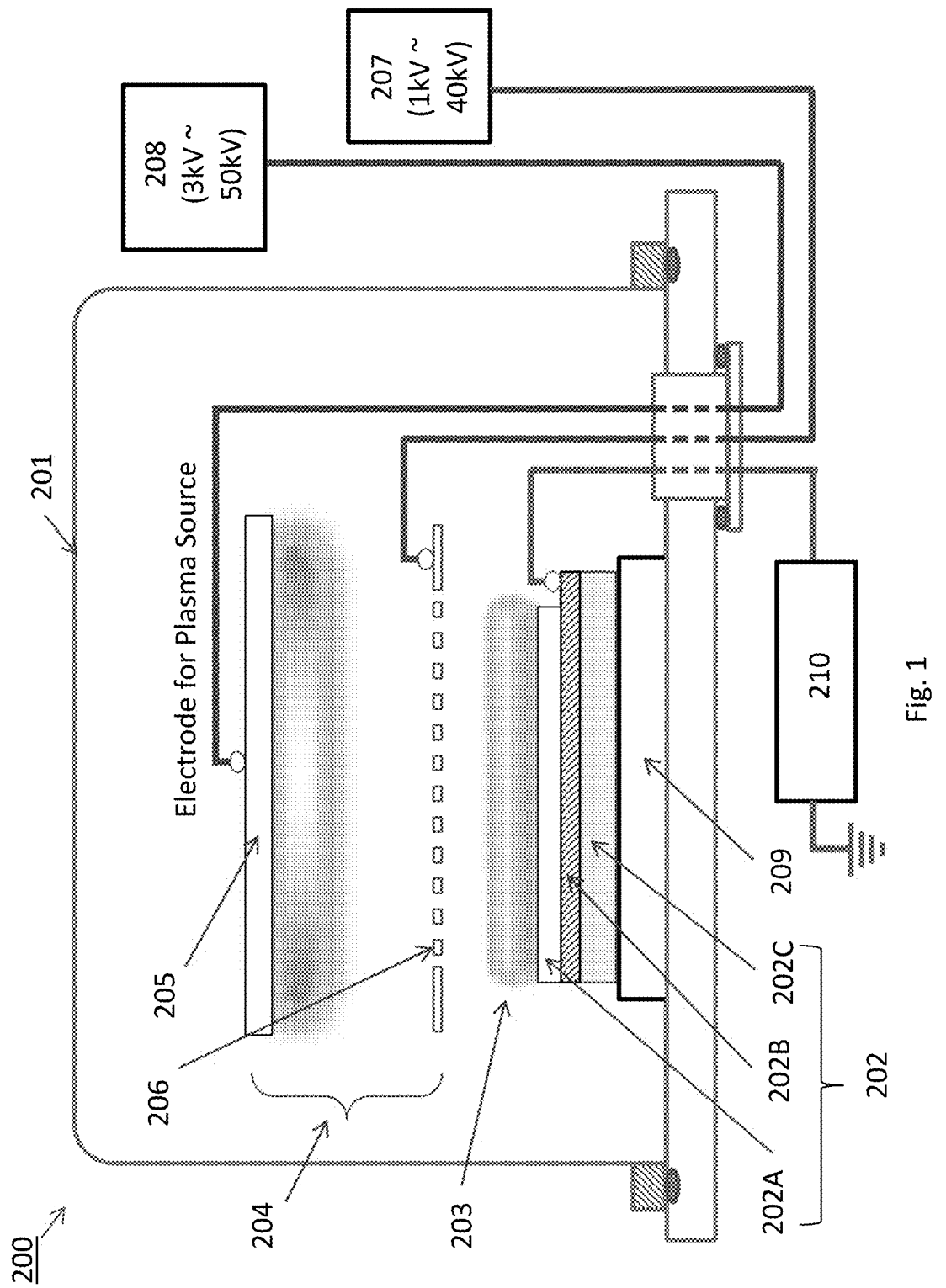
FIG. 1 illustrates the working principle of plasma poling of polymer thin films according to an embodiment of the present invention.

The invention is further described in greater detail below with reference to the attached drawings and embodiments. It is understood that the specific embodiments described herein are only used to explain the invention, but not to limit the invention. In addition, it should be noted that, for the convenience of description, only some but not all structures related to the invention are shown in the drawings.

Before discussing the exemplary embodiments in more detail, it should be mentioned that some exemplary embodiments are described as processes or methods depicted as flowcharts. Although the flowchart describes the steps as sequential processing, many of the steps can be performed in parallel, concurrently, or simultaneously. In addition, the order of the steps can be rearranged. The process may be terminated when its operation is completed, but may also have additional steps not included in the drawings. The process may correspond to methods, functions, procedures, subroutines, subprocesses, and so on.

In addition, the terms "first", "second", etc., may be used herein to describe various directions, actions, steps, or elements, etc., it should be understood that they should not be limited by these terms. These terms are only used to distinguish one direction, action, step, or element from another direction, action, step, or element. For example, without departing from the scope of the present application, the first speed difference may be referred to as the second speed difference, and similarly, the second speed difference may be referred to as the first speed difference. Both the first speed difference and the second speed difference are speed differences, but they are not the same speed difference. The terms "first", "second", etc. should not be interpreted as indicating or suggesting relative importance or implicitly indicating the number of technical features indicated. Therefore, the features defined as "first" and "second" may explicitly or implicitly include one or more of the particular features. In the description of the invention, the meaning of "multiple" is at least two, for example, two, three, etc., unless it is clearly and specifically defined otherwise.

Unlike direct poling, plasma poling is advantageous that no deposited conductive electrodes are necessary on the two surfaces of the polymer thin film. When a uniform, dynamically stable layer of dense electrical charge is formed on the top surface of the polymer thin film, the needed electrical field is readily maintained to be able to conduct quality poling. Although plasma poling is essentially electrodeless, it is practically useful in actual mass production to build in a bottom electrode (often a thin conductive film, such as metal or ITO, i.e. indium tin oxide) underneath the polymer thin film. The bottom electrode so formed serves a few purposes. One such primary purpose is to maintain a stable electrical potential difference between the top of the polymer thin film (in contact of the electrical charge layer) and bottom electrode by electrically grounding the bottom electrode to the apparatus's physical ground. Connecting the bottom electrode to the physical ground may lead to a higher electric field for faster and more spatially uniform poling process which is otherwise not achievable if no bottom electrode were grounded.

Figure 10:
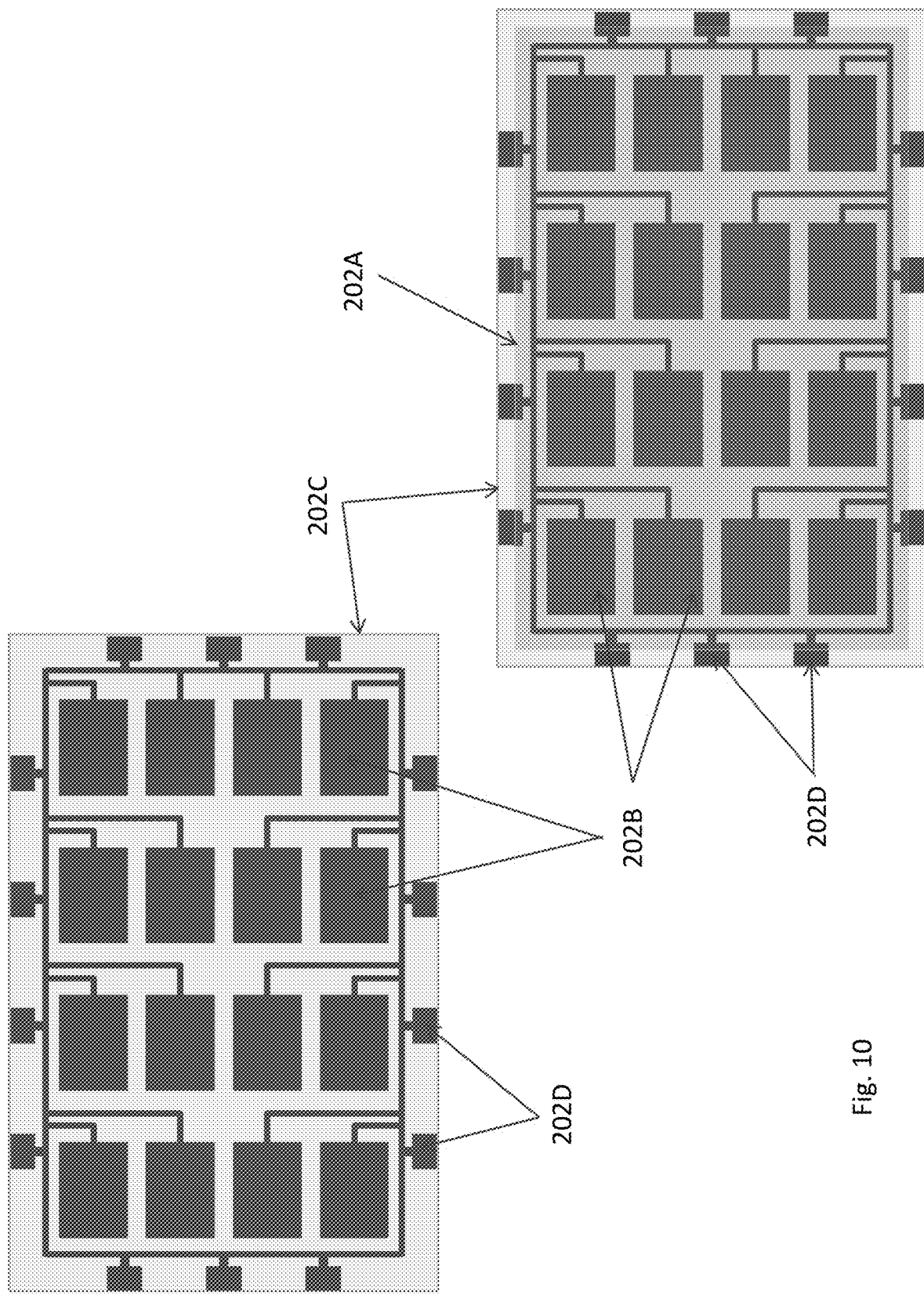
FIG. 10 illustrates a workpiece having a polymer thin films to be processed by the poling apparatus according to an embodiment of the present invention.

FIG. 1 shows the basic configuration and principle of a process module (also referred to as process chamber) 200 for a plasma poling apparatus. Inside an enclosed chamber 201 (for environment isolation), a workpiece 202 is placed on the substrate pedestal 209. As shown in FIG. 10, the workpiece 202 includes a PVDF (or its co-polymer) thin film 202A deposited on bottom electrode layer 202B/202D, which is in turn deposited on a glass (or other insulating, or semiconducting materials) base plate 202C (the bottom electrode layer and the glass base plate may be collectively referred to as the substrate of the workpiece). The bottom electrode layer has an electrode pattern that includes an array of multiple of bottom electrodes 202B, multiple grounding pads 202D that are located along the perimeter of the workpiece, and wires that connect the bottom electrodes to the grounding pads. Each bottom electrode may correspond to an individual device formed by the thin film, and the bottom electrodes may also be referred to as a device array. Each bottom electrodes 202B is electrically connected by wires to at least one of the grounding pads 202D. In the illustrated embodiment, all bottom electrodes 202B and all grounding pads 202D are electrically connected together. The thin film 202A covers substantially the entire area of the substrate but leaves each grounding pad 202D at least partly uncovered. For clarity, FIG. 10 shows a substrate of the workpiece without the thin film and a workpiece with the thin film. In operation, a layer of electric charge (charge cloud) 203 is dynamically formed above the PVDF thin film. This layer of charge contributes largely to generate a strong electric field (typically $10^7$~$10^9$ volt/meter) perpendicular to the thin film surface. The electric field is responsible for polarizing (or poling) the electric dipoles existing inside the PVDF thin film, and for displacing other existing charges inside the thin film. The plasma poling process converts the PVDF thin film so that opposite charges are separated and reside almost permanently near the two separate surfaces of the thin film. Once the conversion completes, the thin film becomes electroactive. For example, piezoelectricity is such an electroactive property that is used of PVDF thin films for pressure sensors and ultrasonic fingerprint sensors.

Referring to FIG. 1 again, continuous supply of electric charge flux is facilitated by a poling source 204, which includes a plasma source 205 and a grid electrode 206. The grid electrode is set at a different electrical potential than that of the plasma source. Electric charges both positive and negative are first generated by ionizing processing gases inside the plasma source. The like electrical charges (e.g., electrons, negatively charged ions or molecular species) are then attracted by the grid electrode (which is set by a grid power supply 207 at a slightly higher electrical potential than that of the plasma source set by a plasma source power supply 208) and pass the openings of the grid, eventually reaching a region adjacent to the surface of the thin film to dynamically form the charge cloud. In general, the plasma source may be based on a number of gas ionizing mechanisms or implementations. These may include gas discharges excited by DC (direct current), RF (radio frequency), microwave, pulsed DC, X-ray, and possible combinations thereof.

Figure 2:
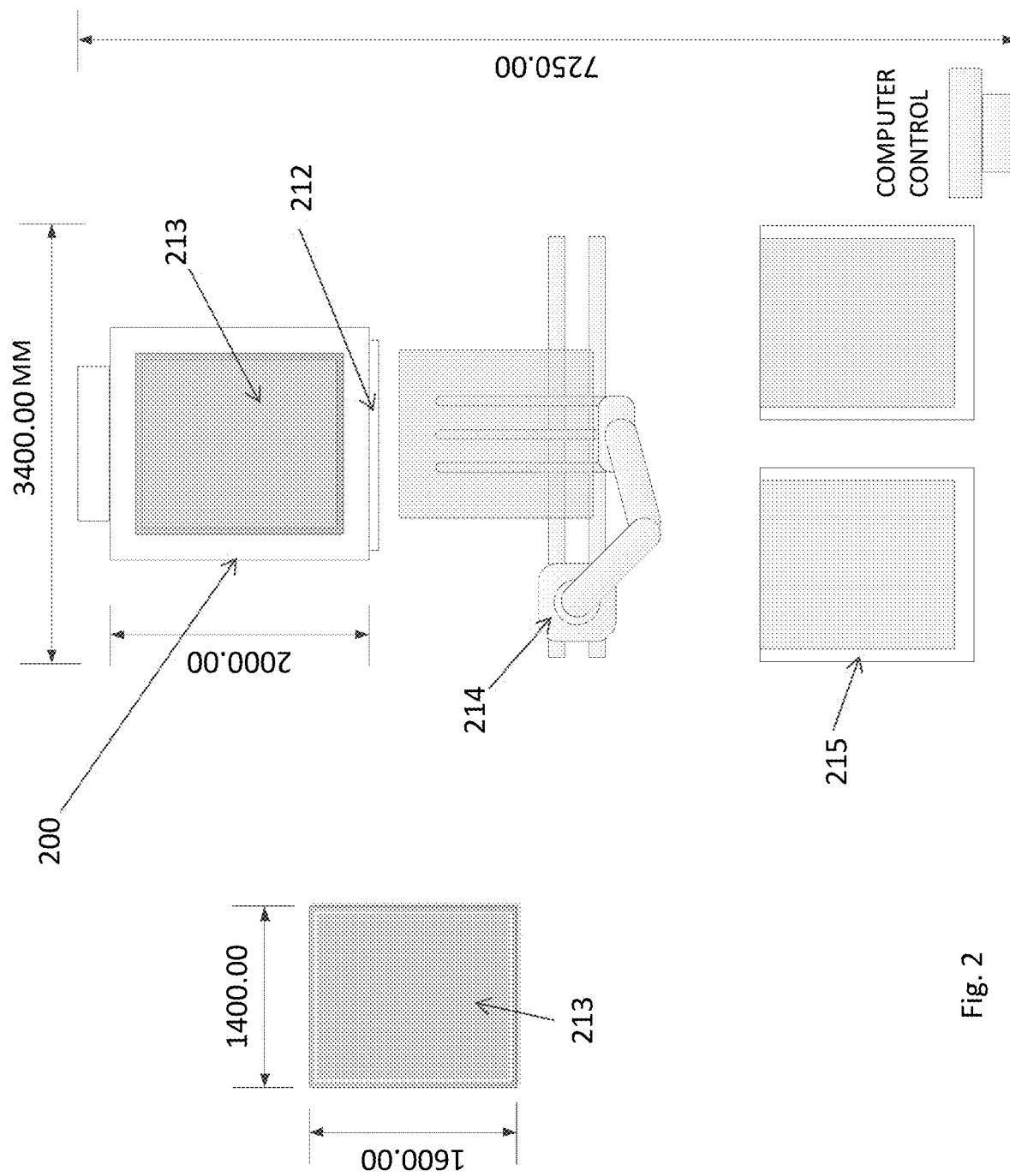
FIG. 2 shows the system architecture including key functional modules for mass production process for poling thin films in accordance with an embodiment of the present invention.

For mass production of poling polymer thin films, system architecture of the apparatus in accordance with an embodiment of the current invention is illustrated by FIG. 2. Incoming workpieces (e.g., polymer thin films deposited on glass substrates) are picked up by a front-end robot or other suitable devices 214 from workpiece storage cassettes 215 and subsequently transferred into the process module 200. The process module is where poling operation is carried out, along with other ancillary substrate handling and preparation operations before and after the actual poling process. Once the poling process is finished, the front-end robot reaches inside the process module, picks up the processed workpiece, and transfers it back to the workpiece storage cassette. More than one cassette may be featured for productivity reasons. FIG. 2 also shows some exemplary dimensions of the various components of the system.

The system and process generally include the following features: 1. Consolidate preparation function and processing function into one process module. Preparation is to condition the glass substrate ready for subsequent processing, which is to polarize (or pole) the polymer thin film. 2. Grounding mechanisms are installed inside the process chamber. This eliminates the need to prepare the substrate with other modules or robotic mechanisms. 3. An isolation door 212 is provided at the front of the process module. When the door is open, the front-end robot picks up the workpiece to be processed from a cassette and transfers the workpiece into the process module where the workpiece carrier 213 is housed. 4. The workpiece in the carrier will then be raised by a Z-elevator inside the process module to engage with grounding mechanisms in the module to condition the grounding needed for poling process. 5. The above procedure is also concurrent with setting the gap between poling source and the glass substrate by the Z-elevator. 6. Poling process is initiated and continues until it is finished. 7. The workpiece in the carrier is then lowered by Z-elevator, while being disengaged with the grounding mechanisms at the same time.

Figure 3:
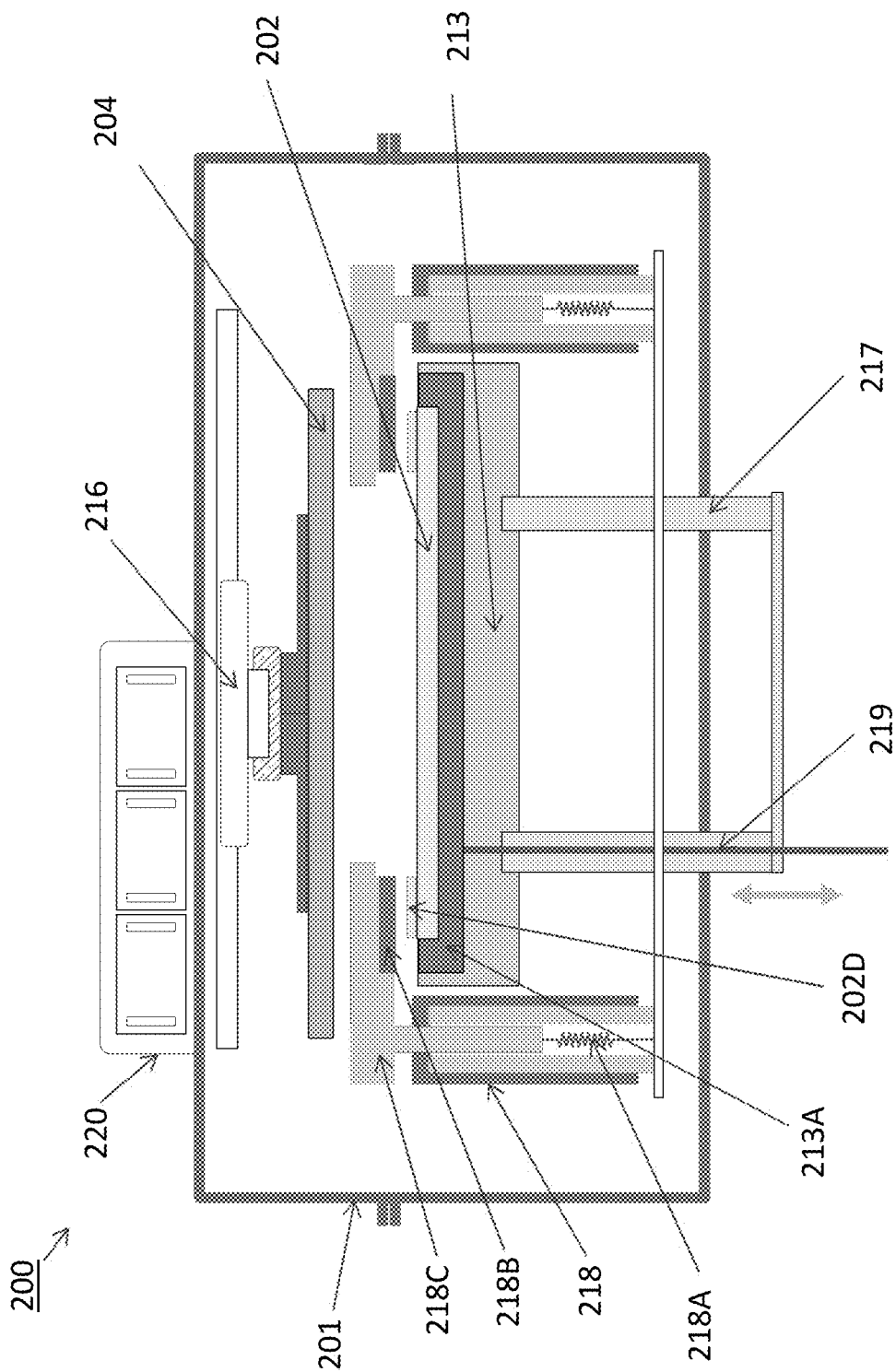
FIG. 3 is an overview of the process module of the apparatus for poling polymer thin films in accordance with an embodiment of this invention.

Further shown in FIG. 3, inside the process module 200, an X-Y scanning stage 216 drives a large area poling source 204 in horizontal plane to supply needed charge flux to enable poling over large area workpiece 202 (the array of bottom electrodes and the thin film are not shown). The workpiece is situated inside a workpiece carrier 213, which can be raised or lowered by a vertically moving Z-elevator 217 controlled by a precision servo motor. The Z-elevator sets the distance or gap (the process gap) between the surface of the workpiece 202 and the bottom of the poling source 204 which is an importance process parameter during poling operation. Although plasma poling is basically electrodeless, it is of advantage to have a bottom electrode 202B (wired to the grounding pads 202D that are located along the perimeter of the workpiece, see also FIG. 10) connected to a controlled electrical potential reference in mass production. Such potential reference may be the physical ground of the apparatus itself. To facilitate electrical connection between the physical ground (and monitoring instrument) of the apparatus and the grounding pads built-in on the circuitry of the workpiece, grounding mechanisms 218, as functional components of the process module 200, are constructed along the peripheral surrounding the workpiece carrier 213. The grounding mechanisms may include extension damping mechanisms 218A (e.g. extension springing dampers with sliding guides, or other resilient members), and electrical contacts 218B which are mechanically connected to the extension damping mechanisms, where the electrical contacts are biased by the extension damping mechanisms downwardly to be able to engage with grounding pads 202D on the workpiece during poling operation.

Figure 4:
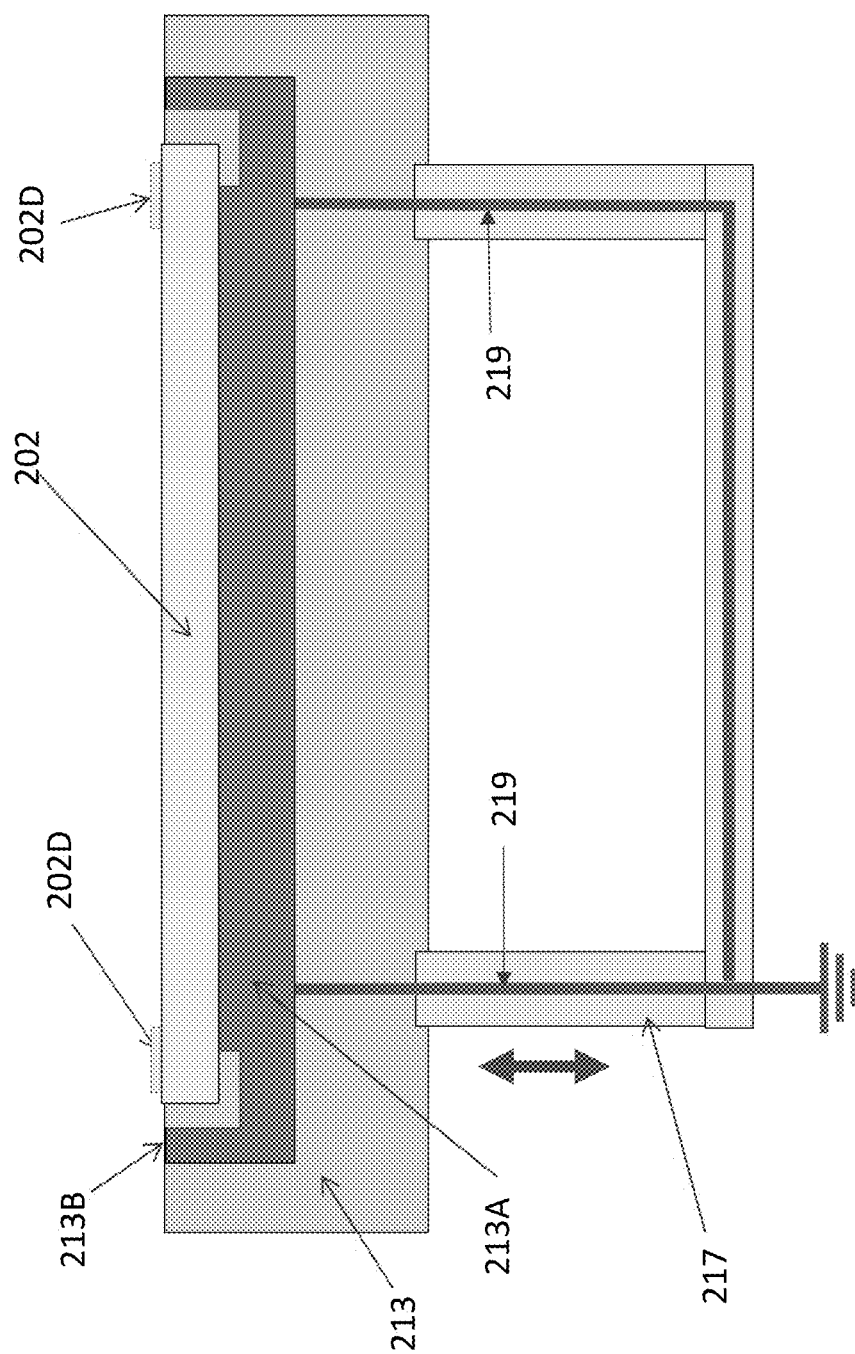
FIG. 4 illustrates further the basic construct of workpiece carrier inside the process module, which is shown in FIG. 3.
Figure 5:
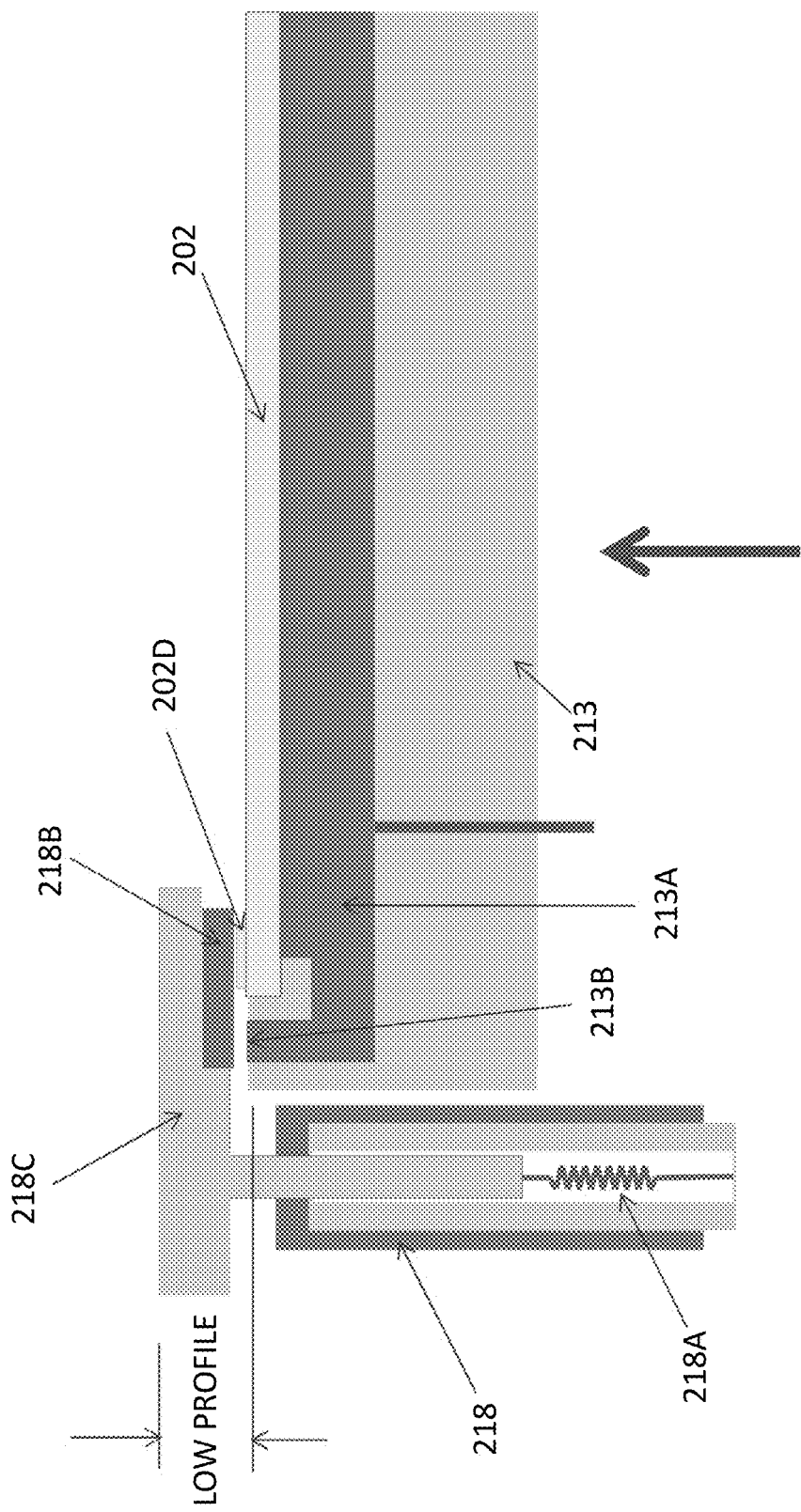
FIG. 5 illustrates how grounding of bottom electrode (on workpiece) is implemented before poling process starts.

Cross-referring to both FIGS. 4 and 5, the workpiece carrier 213 has a built-in electrically conducting (e.g. metal) lining 213A as a base plate supporting the glass substrate 202C. The rest of the carrier 213 (the platform) is form of, e.g., an insulating polymer structure. The lining 213A has one or more portions 213B that are exposed at the top surface of the carrier around the recess, at locations (in the top view) adjacent to the grounding pads of the 202D of the workpiece, so that they will be electrically coupled to the grounding pads 202D of the workpiece by the electrical contacts 218B of the grounding mechanism. In addition, this conductive lining is wired by conductive grounding cables 219 to the apparatus's physical ground and an instrument (often an electrometer) 210 (see FIG. 1), which is used to monitor the poling process. Before and after poling when the workpiece carrier is in a lowered position, the grounding pads 202D around the edges on the workpiece are not electrically connected to the apparatus's ground since the workpiece carrier is not engaged with the grounding mechanisms mounted inside the process module. Now, in order to condition or prepare the workpiece for actual poling, the workpiece already inside the carrier 213 is being raised by the Z-elevator (as indicated by the upward arrow) from a lowered position; along its way up, the workpiece captures and engages with the grounding mechanisms such that the conductive pads (e.g. conductive foam pads) 218B hidden underneath an otherwise insulating cover 218C (of the grounding mechanisms) is gradually brought into electrical contact with the matching grounding pads 202D on the glass substrate (workpiece). In this process, the conductive pads 218B also comes into contact with the exposed lining portion 213B, thereby electrically connecting the lining 213A with the grounding pads 202D of the workpiece. When the Z-elevator stops at a pre-programmed height defining the process gap, grounding from the workpiece to the apparatus's ground and to the monitoring instrument is secured with the aid of the extension dampers inside individual grounding mechanisms. Note that in FIGS. 3, 4 and 5, the grounding pads 202D are depicted as having a substantial thickness and protruding above the rest of the surface of the workpiece 202; this is an exaggerated depiction, as the actual grounding pads are thin and do not appreciably protrude from the workpiece surface. At the pre-set process gap between the poling source and the workpiece, the plasma source and grid electrode are turned on to carry on the poling process.

The grounding mechanism may include multiple individual mechanisms disposed at different locations around the workpiece carrier. For example, four grounding mechanisms having elongated shapes in the top view may be provided, respectively along the four sides of the workpiece carrier. Alternatively, multiple grounding mechanisms may be disposed along each side of the grounding mechanisms. The grounding mechanism may also be constructed as one piece having a rectangular shape in the top view. In such a case, the cover 218C is be a closed frame with an opening that is slightly smaller than the workpiece, where the inner edges of the frame cover one or more (e.g. all) edges of the workpiece but the opening exposes the entire thin film 202A, and the conductive pads 218B are on the underside of the inner edges of the frame that covers the edges of the workpiece. In all cases, the cover 218C and the conductive pads 218B leave the entire thin film uncovered and exposed to the plasma cloud.

Figure 6:
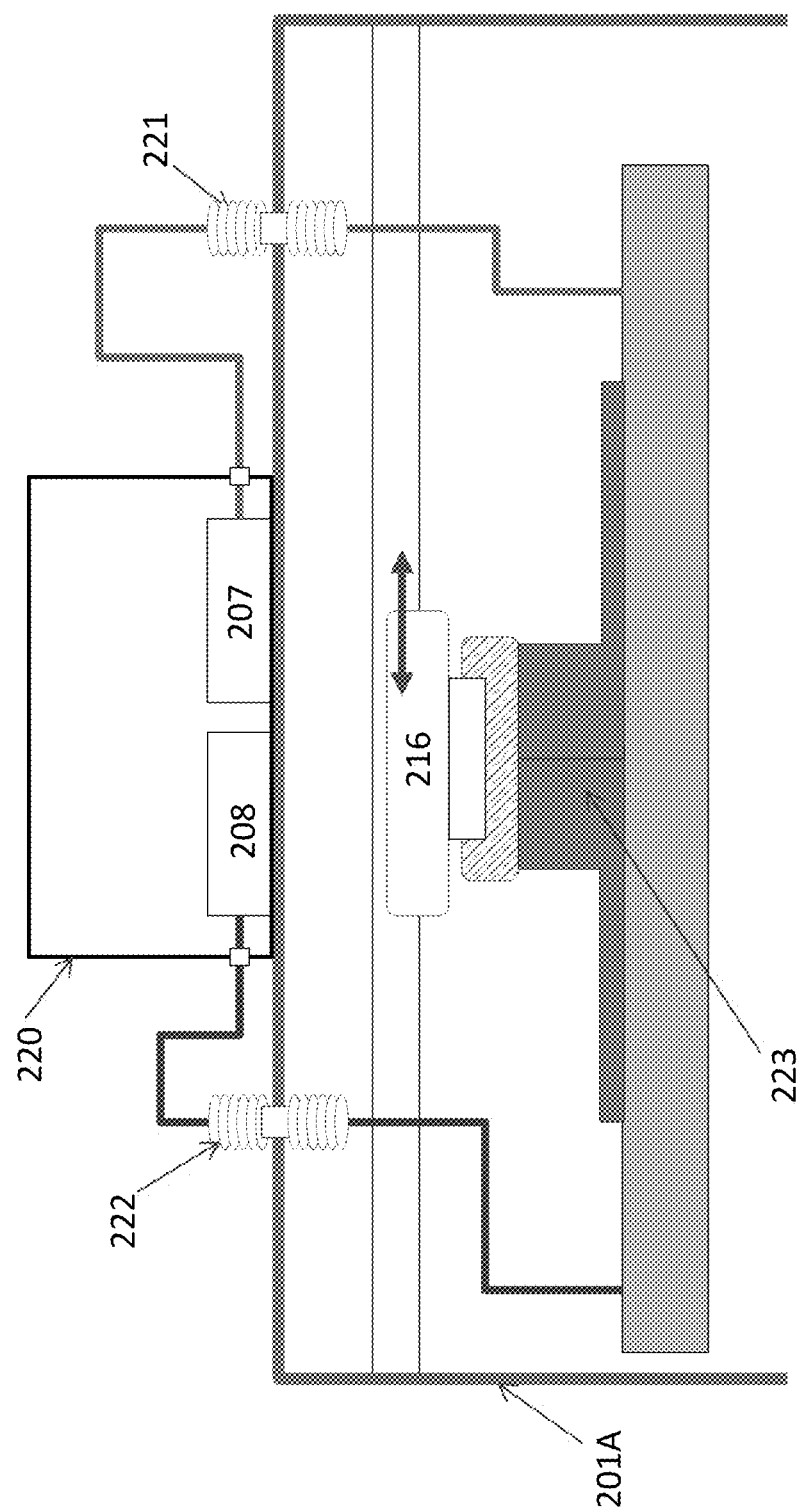
FIG. 6 illustrates large area poling source in relation to its surroundings in the process module in terms of electromechanical integration.
Figure 7:
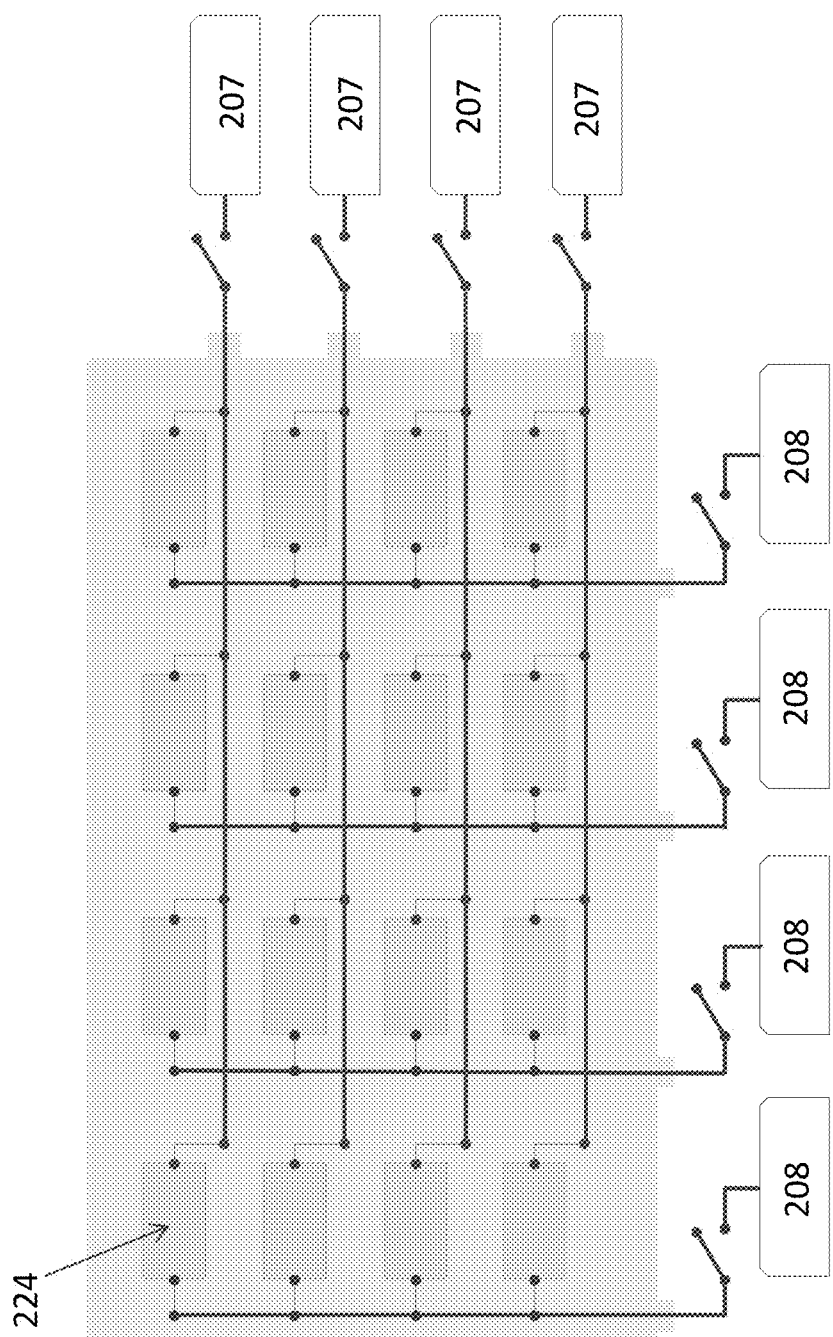
FIG. 7 shows how the large area poling source is electrically wired by using arrayed, smaller poling sources.

As briefly introduced earlier, in the process module 200, a poling source 204 supplies needed electric charge flux to dynamically maintain a layer of charge cloud 203 to enable poling the polymer thin film with strong electric field. FIGS. 6 and 7 show the poling source in more details, and illustrates the integration of the poling source with the enclosure 201. The X-Y scanning stage 216 and the poling source 204 are mounted within a liftable top enclosure structure 201A of the process module. A cabinet 220 containing the power supplies and control devices is also mounted on the liftable top enclosure structure 201A. Power to the plasma source 205 and grid electrode 206 is conducted to the source bus and grid bus inside the enclosure via high voltage feedthroughs 221 and 222, respectively. For processing large area workpiece (on the meter scale), an X-Y scanning poling source is very helpful to achieve uniform poling. The large area scanning poling source shown in FIG. 6 is constructed by arranging multiple smaller poling sources mounted on a mounting structure 223, each of which can be considered as a poling source itself but only covers a much smaller area. As may be required by the industry to gradually upgrade the size of device substrate, the scanning poling source is readily scalable by an arrayed structure as shown in FIG. 7. The arrayed structure includes multiple poling source groups 224 electrically connected to power supplies in an electrical circuitry such as that shown in FIG. 7. In the illustrated example, multiple (e.g. 10) individual poling sources (such as 204) form a group 224, which are in turn arrayed. Multiple power supplies 207, 208 may be used to supply power to the multiple poling source groups via high voltage relays. Each grid power supply 207 and plasma source power supply 208 may be, for example, a −18 kV DC, 60 VA power supply. Based on this arrayed design, the apparatus can be scaled up and process workpieces of almost any size, from 200 mm silicon wafers, Gen2.5 glass (370× 470 mm), Gen6 glass (1850×1500 mm), all the way to Gen10.5 glass (2940×3370 mm), for example.

Figure 8:
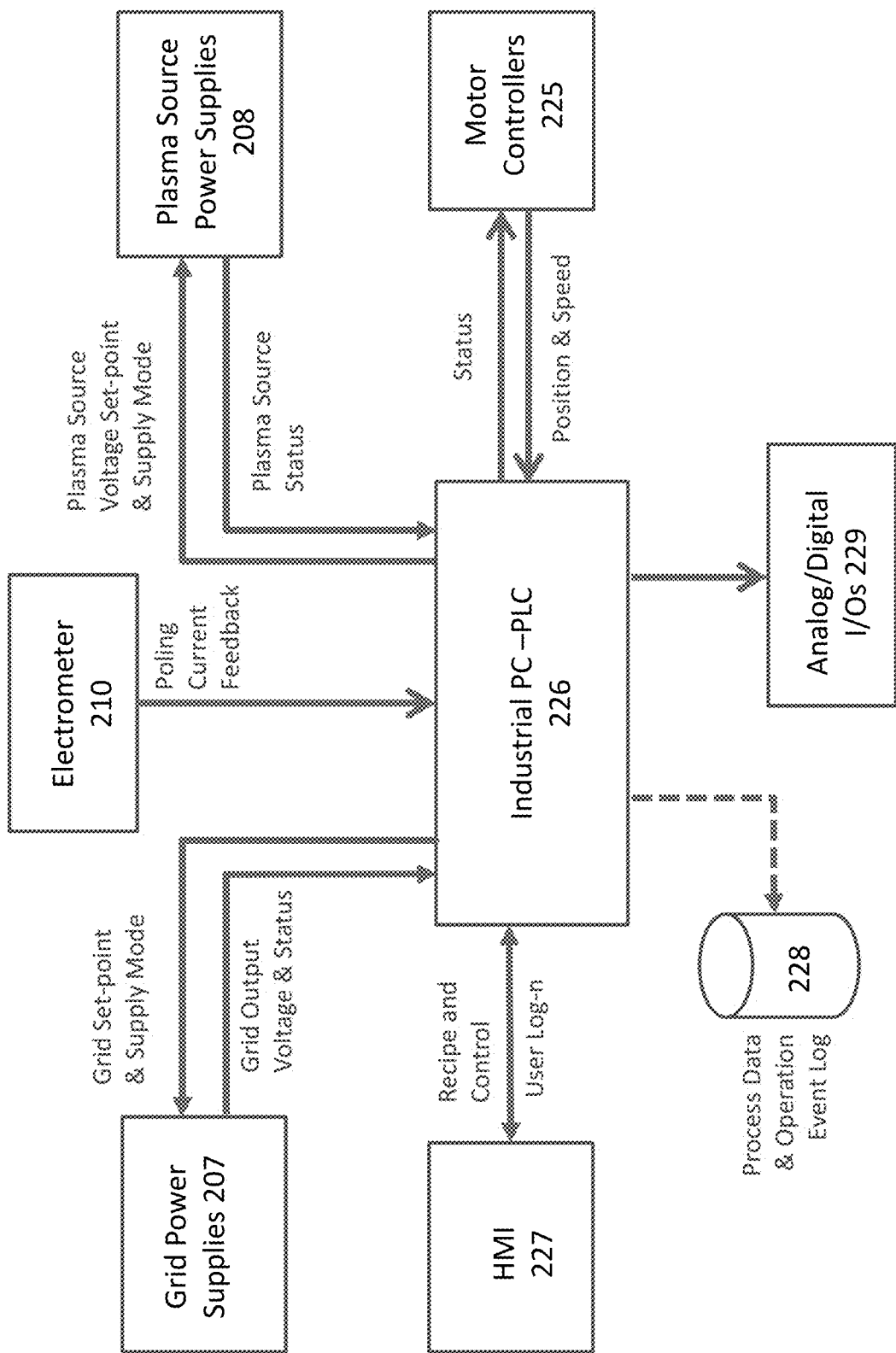
FIG. 8 is a block diagram showing components of a system for poling polymer thin films according to an embodiment of the present invention.
Figure 9:
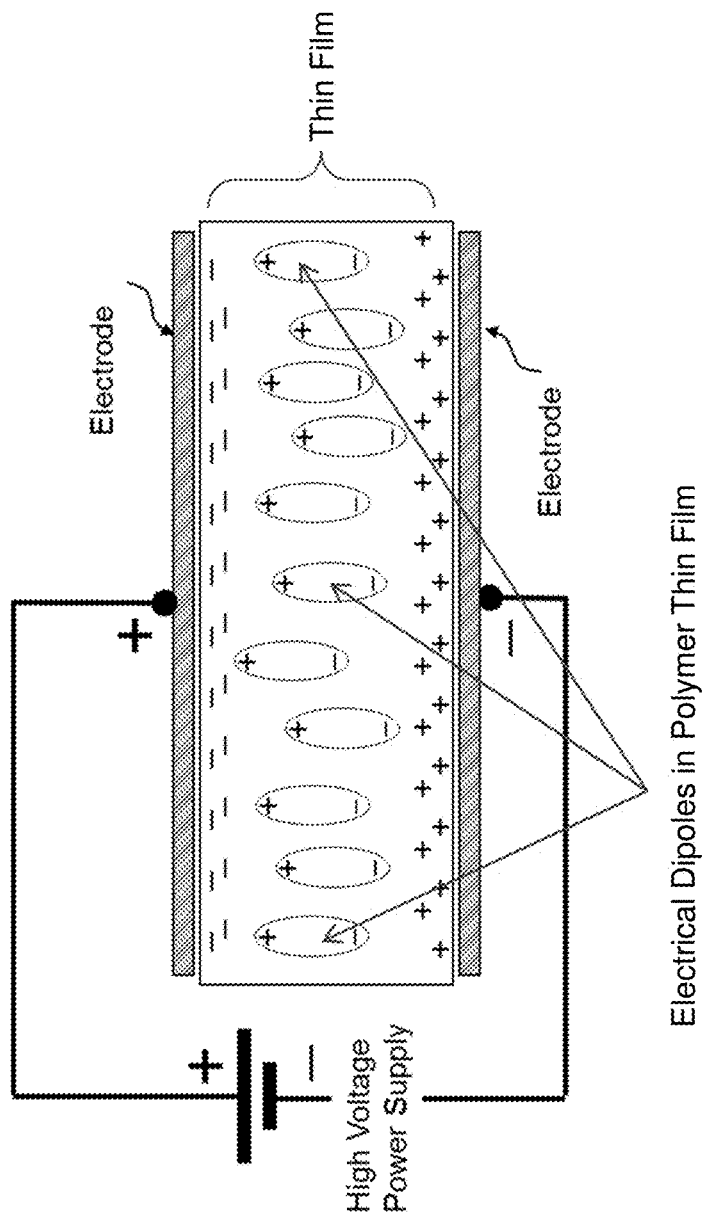
FIG. 9 illustrates the principle of direct poling of polymer thin films.

FIG. 8 is a block diagram showing components of the polymer thin film poling system according to an embodiment of the present invention. The components mentioned above, including the plasma source power supplies 208, grid power supplies 207, electrometer 210, and motor controllers 225 for the Z-elevator server motor are connected to and controlled by a controller 226 which may be an industrial computer or programmable logic controller. The system also includes a human machine interface 227, data storage (memory) 228, and analog/digital I/Os 229, also connected to the controller.

The preferred embodiment of this invention has proposed an efficient system architecture for the disclosed apparatus to process workpiece in a manner that sequential preparation (conditioning) and poling functions are integrated into one module. This architecture eliminates the need for separate preparation stations (or modules) dedicated to grounding operation of the workpiece prior to the poling operation. It in turn reduces apparatus's cost, as well as its footprint, which is a valuable feature for semiconductor, display and sensor factories.

By adopting modularized, arrayed poling sources, the disclosed apparatus design is capable of scaling up in substrate size easily and systematically. Furthermore, with arrayed sources, effort to troubleshoot large area poling source becomes less and more cost effective, since failed individual poling sources may be easily identified and replaced without taking down or discarding the entire large area poling source.

The disclosed method of grounding the bottom electrode underneath the polymer thin film can be easily implemented in mass production. It enables faster process for poling since the electrical potential of the bottom electrode is prevented from floating up with little control in a plasma inside the process module. Plasma induced potential floating may occur if the bottom electrode were not grounded otherwise. The electric field strength across the surfaces of the polymer thin film is determined by the difference of electrical potentials on the two surfaces. Besides helping with poling speed, the method also enables uniform poling over large areas because all the bottom electrodes of devices laid out over the substrate can be kept at a common electrical potential.

The above method of grounding is also very important to realize higher yield in mass production with plasma poling. In many cases where active sensing devices are involved, the PVDF thin films need to be fabricated on top of other active circuitries such as CMOS or TFT (thin film transistor) devices. To avoid possible plasma or high voltage damages to those active devices already built in on the substrate, certain protective circuitries must be considered in order to carry our poling operation. During poling process, these protective circuitries must be connected to the common grounding pads on the substrate which are subsequently connected to the physical ground of the poling apparatus.

Another embodiment of the invention is described with reference to FIGS. 11-17 below. The workpiece and polling chamber themselves in this embodiment is similar to that in the embodiments of FIGS. 1-10, but the system uses a different workpiece transport structure.

Figure 11:
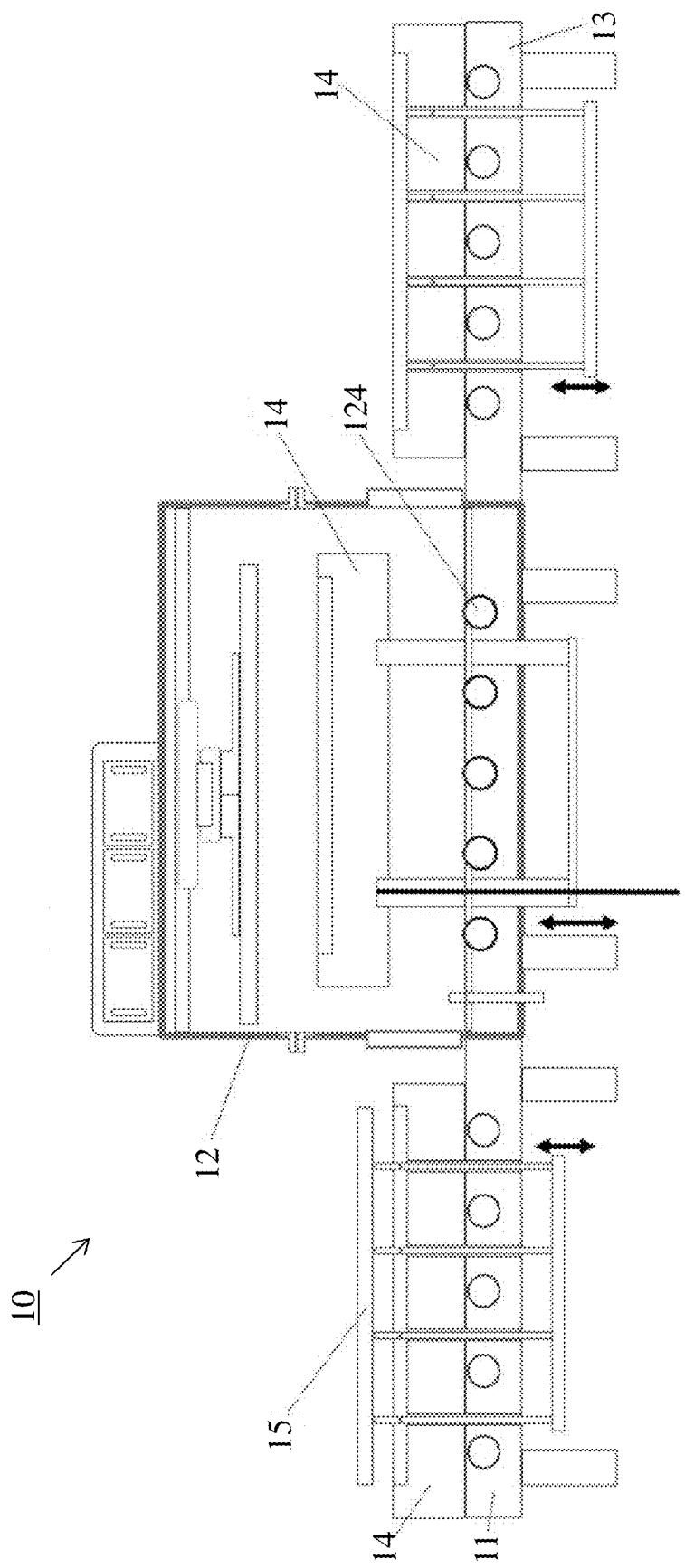
FIG. 11 is a schematic structural diagram of the poling device according to another embodiment of the present invention.

Referring to FIG. 11: The first embodiment of the current disclosure provides a poling system 10 used to polarize a workpiece 15. The poling system 10 includes: preparation platform 11, poling chamber 12, transfer platform 13, and carrier platform 14. The poling chamber 12 is positioned between the preparation platform 11 and the transfer platform 13. The preparation platform 11 is used to hold the carrier platform 14 before being sent into the poling chamber 12. The carrier platform 14 is used to hold the workpiece 15. The poling chamber 12 polarizes the workpiece 15 on the carrier platform 14. The transfer platform 13 is used to hold the workpiece 15 after it has been polarized. Specifically, when the carrier platform 14 is transferred to the preparation platform 11, the workpiece 15 is placed on to the carrier platform 14. When the carrier platform 14 and the workpiece 15 are moved into the poling chamber 12, said workpiece 15 is then polymerized in the poling chamber 12. Upon completion of polymerization, the carrier platform 14, along with the workpiece 15, is moved to the transfer platform 13. The polymer workpiece 15 is then subsequently removed from the carrier platform 14.

Figure 12:
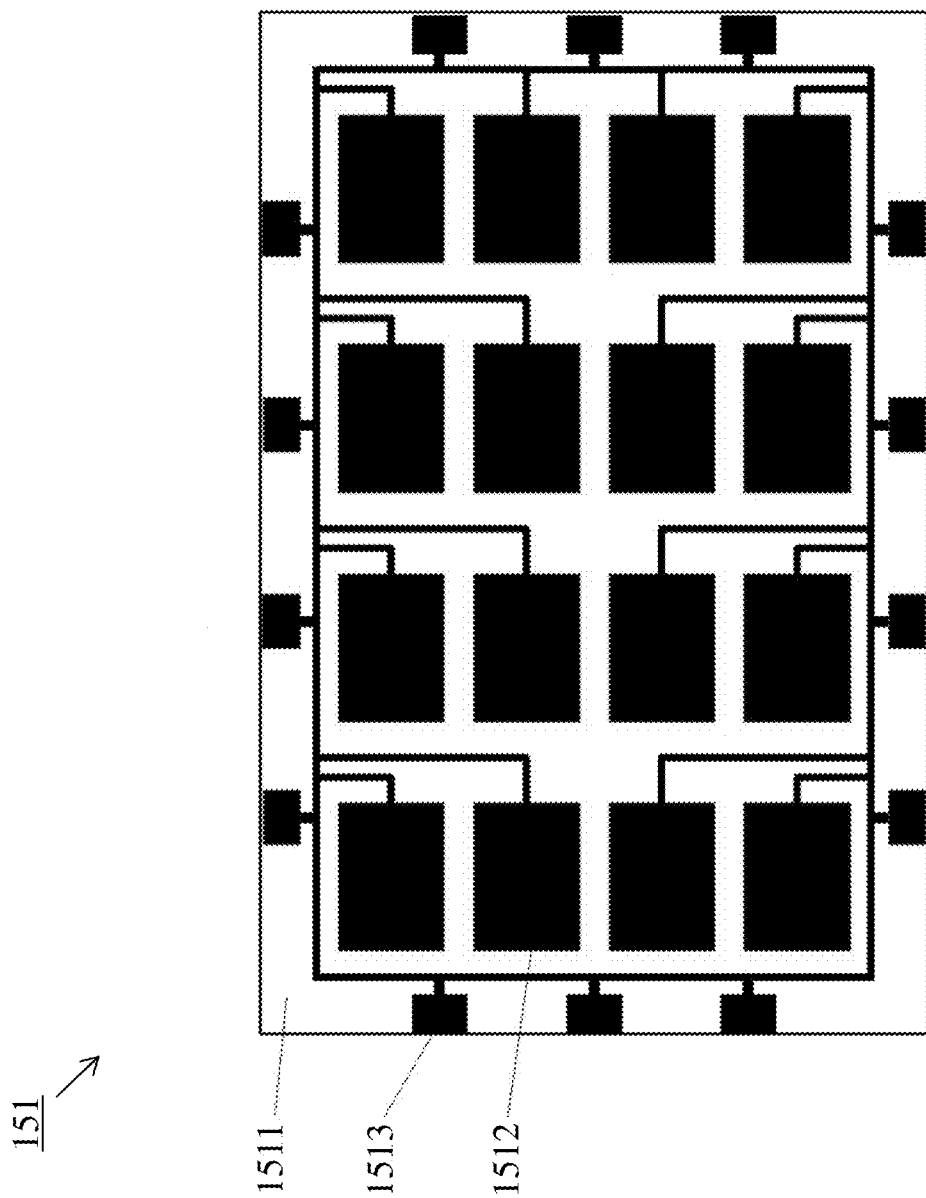
FIG. 12 is a schematic structural diagram of the substrate, according to the embodiment of the present invention.

Referring to FIG. 12: The workpiece 15 includes substrate 151 and the polymer thin film formed on the substrate 151 (not shown in the figure). Preferably, the polymer forms into a thin film in-situ on the substrate 151. After the workpiece 15 is polarized, it can be cut into multiple pieces. As multiple regions are polarized simultaneously, the speed of polarization is enhanced. The formation of the polymer thin film that takes place, in-situ, at the surface of the substrate 151, which yields a substrate 151 with a polymer thin film attached and ready for poling—which is the workpiece 15. This is a key difference between known current technology and this embodiment. The known current technology involves the attachment, via adhesion, of a preformed polymer thin film to a substrate, followed by poling process. Usually, the preformed polymer thin film has to be first stretched to certain stress so that it can be placed on, and adhere to a substrate before poling can take place. For the known current technology, the polymer thin film usually has to be thicker than 30 µm, which is not suited for current trends that pursue light and thin electronic components. Also, the piezoelectric inductance devices using such films provide less resolution due to the thick film. In this embodiment of the present invention, the polymer thin film is formed in-situ at the surface of the substrate 151 through spin coating, screen printing, and slit coating techniques. This allows the formation of very thin polymer thin films, usually kept under 9 µm. The piezoelectric sensing devices using such in-situ formed polarized polymer thin films provide much better resolution. This embodiment also can broaden the scope of electronic component designs as thin films of varying thicknesses can be employed. The polymer thin films may be ferroelectric polymer thin films, such as: polyvinylidene fluoride (PVDF), polyvinylidene fluoride trifluoroethylene (PVDF-TrFE), polymethyl methacrylate (PMMA), or polytetrafuoroethylene (TEFLON).

The substrate 151 includes: a base plate 1511, grounding electrodes 1512, and grounding pads 1513. The grounding pads 1513 are located at the edges of the base plate 1511. Grounding pads 1513 and grounding electrodes 1512 are on the same surface of the base plate 1511. The grounding electrode 1512 and grounding pad 1513 are electrically connected. The polymer thin film covers the grounding electrode 1512, with the grounding pad 1513 remaining exposed. The substrate 151 may be a glass substrate.

There may be multiple grounding electrodes 1512. The grounding electrodes are aligned in a matrix format on the base plate 1511. The polymer thin film is formed in-situ on the surface of the base plate 1511, including the grounding electrodes 1512, and the grounding pads 1513. The polymer thin film covers the grounding electrodes 1512, but leaves the grounding pads 1513 at least partially exposed. The grounding pads 1513 are electrically connected to the polymer thin film via the grounding electrodes 1512. The grounding electrodes 1512 may be a sheet or mesh. The shape of the grounding electrode 1512 is consistent with the shape of each small piece of the workpiece that will be cut from the workpiece 15 after poling. The electric potential is zero at the polymer thin film and the grounding electrode 1512 when the grounding electrode 1512 is grounded.

Figure 13:
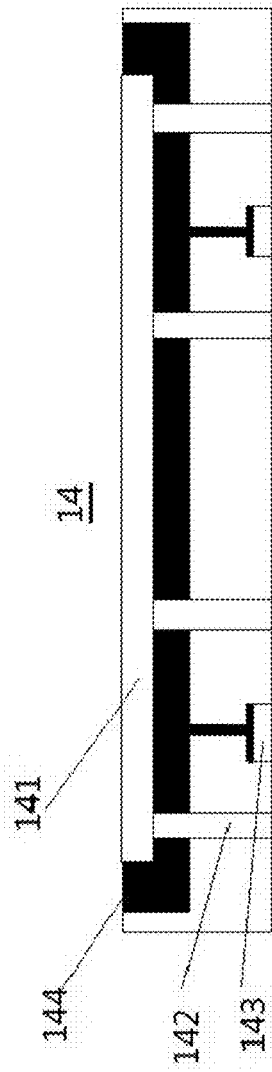
FIG. 13 is a schematic structural diagram of the carrier platform according to the embodiment of the present invention.

Referring to FIG. 13: The carrier platform 14 is horizontally flat in shape and has a substrate carrying recess 141 at the top. At the base of the substrate carrying recess 141 there are at two openings that vertically pass through the carrier platform 14 to form the jacking holes 142. On the surface of the carrier platform 14 opposite to that of the substrate carrying recess 141, there are grounding ports 143. There are also carrier electrodes 144 on the carrier platform 14. Some carrier electrodes 144 are at the bottom of the grounding ports 143, while some are placed at the sides and top surrounding the substrate carrying recess 141. It is understood that the placement of carrier electrodes 144 at the base of the substrate carrying recess 141 is an option. The carrier electrodes 144 at different positions are mutually electrically connected. The carrier recess 141 is configured to hold he workpiece 15. When the workpiece 15 is placed in the substrate carrying recess 141, the top surface of the polymer workpiece 15 is either flush with or higher than the upper surface of the edge around the substrate carrying recess 141. The jacking hole 142 is configured for an external device to pass through it to elevate the polymer workpiece 15. The grounding port 143 is configured for another external device to be inserted into it to ground the carrier electrode 144. The grounding port 143 is also configured for the external device to be inserted to elevate the carrier platform 14 while grounding the electric circuit. If there are carrier electrodes 144 placed at the base and at the sides of the substrate carrying recess 141, and the grounding port 143 is made deep enough, then it is understood that the carrier electrode 144 at the base of the substrate carrying recess is at the deep end of the grounding port 143.

Figure 14:
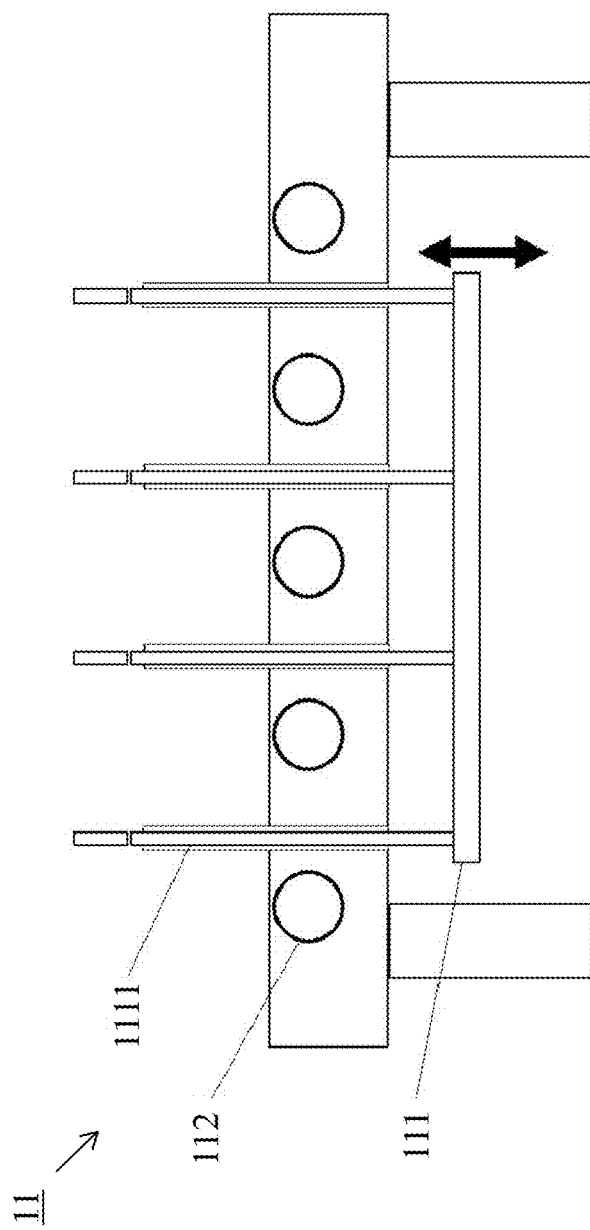
FIG. 14 is a schematic structural diagram of the preparation platform according to the embodiment of the present invention.

Referring to FIG. 14: The preparation platform 11 includes the first conveyor system 112 and the first Z-elevator 111. The first Z-elevator 111 is below the first conveyor system 112. The first conveyor system 112 moves the carrier platform 14 to a preset first position. Then the first Z-elevator 111 passes through the conveyor system 112 and then through the jacking hole 142 of the carrier platform 14. A first external conveyor system places the workpiece 15 on top of the first Z-elevator 111. The first Z-elevator 111 lowers to place the workpiece 15 into the substrate carrying recess 141. Preferably, the preparation platform 11 includes a first sensor, which is used to detect the position of the carrier platform 14. As the carrier platform 14 reaches the preset first position, the first sensor signals the first conveyor system 112 to stop the carrier platform 14. The type of the first sensor is not limited. It may be a position limit sensor. It is understood that the poling system 10 may also include a controller. The controller is electrically connected to the first sensor and the first conveyor system 112. When the first sensor senses that the carrier platform 14 is at the preset first position, the control system stops the movement of the first conveyor system 112.

The first conveyor system 112 includes multiple rollers (not labeled) spaced apart, with gaps between rollers. As the rollers rotate, they causes the carrier platform 14 on them to move. The gaps between the rollers provide space through which the first Z-elevator 111 passes. The structure of the first conveyor system 112 is not limited. For instance, the first conveyor system 112 may alternatively include a conveyor belt with gaps. As the first Z-elevator 111 lowers, and the polymer workpiece 15 is placed into the substrate carrying recess 141, the first conveyor system 112 moves and sends the carrier platform 14 into the poling chamber 12.

The first Z-elevator 111 includes first elevating rods 1111 and a first motor (not shown). The first motor drives the first elevating rods 1111 up and down. There may be multiple first elevating rods 1111. The number of the first elevating rods 1111 matches the number of the jacking holes 142, and the positions of the elevating rods 1111 and the jacking holes 142 correspond to each other. The first elevating rods 1111 move up and down through the corresponding first jacking holes 142. As the first elevating rods 1111 move up through the first jacking holes 142, the first external conveyor system places the workpiece 15 on top of the first elevating rods 1111 of the first Z-elevator 111. Preferably, there are at least 3 sets of first elevating rod 1111 and jacking hole 142, to stably support the workpiece 15 atop the first elevating rods 1111 and to prevent the workpiece from toppling.

Figure 15:
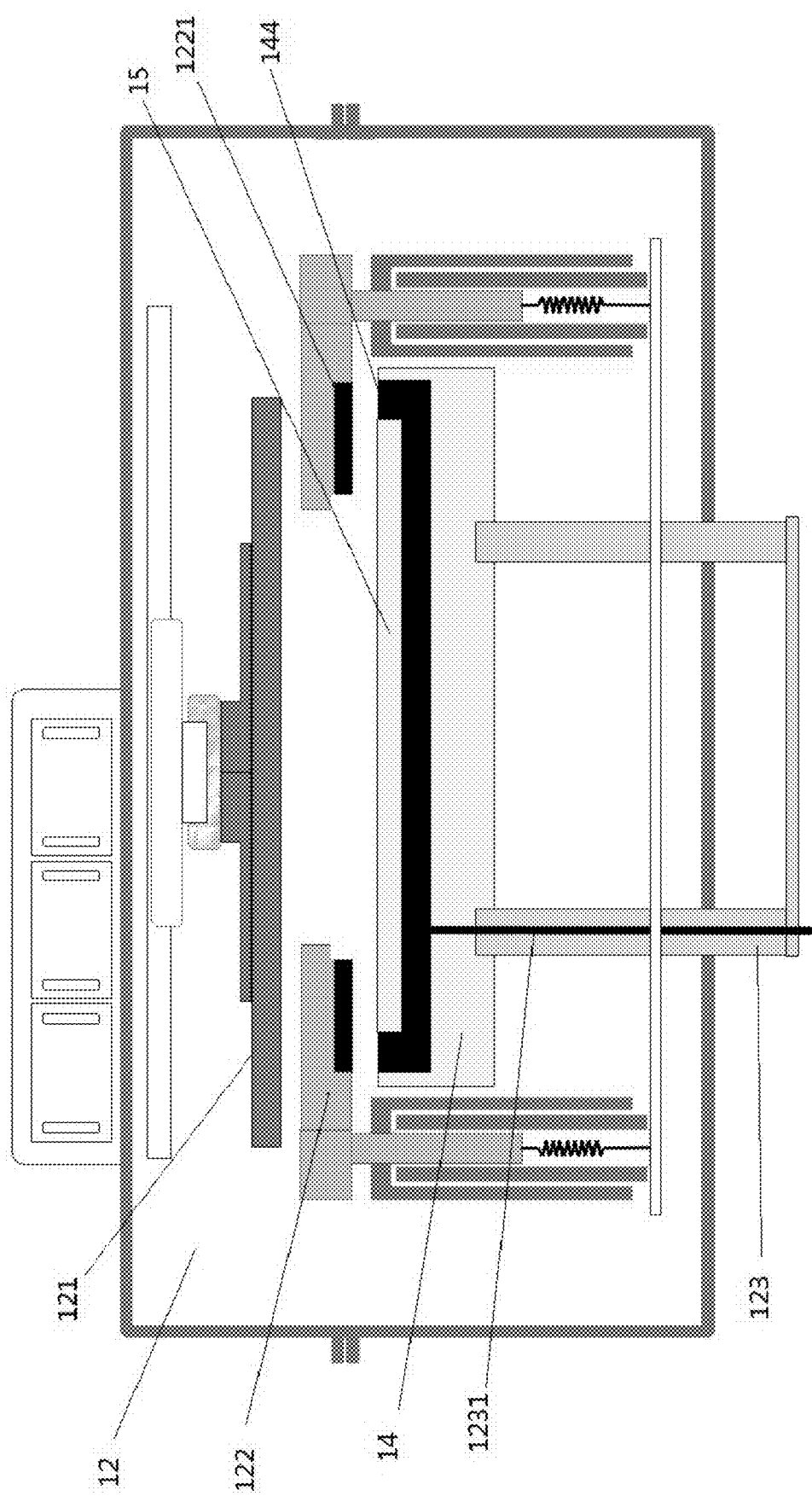
FIG. 15 is a schematic structural diagram of the polarization chamber according to the embodiment of the present invention.

Referring to FIG. 15 along with FIG. 11: The poling chamber 12 includes the poling assembly 121, the second conveyor system 124, the second Z-elevator 123, and the cover 122. The cover 122 includes a conductive pad (e.g. a conductive foam pad) 1221 and is otherwise insulating. The second Z-elevator 123 includes one or more grounding wires 1231. The second Z-elevator 123 is positioned below the second conveyor system 124. The poling assembly 121 is placed above the second conveyor system 124. The cover 122 is between the second conveyor system 124 and the poling assembly 121. The poling assembly 121 is above the cover 122. After the carrier platform 14 is positioned by the second conveyor system 124 to a preset second position, the second Z-elevator 123 rises, allowing it to pass through the second conveyor system 124 and to be inserted into the jacking holes 142 of the carrier platform 14. This causes the carrier platform 14 to rise and come into contact with the cover 122. The cover 122 covers the grounding pads 1513 of the workpiece 15 and exposes the polymer thin film of workpiece 15. The conductive pads 1221 of the cover 122 simultaneously connect with the grounding pads 1513 of the workpiece 15 and the carrier electrodes 144 on the sides of the substrate carrying recess 141. The grounding wire 1231 of the second Z-elevator 123 has a portion that is exposed at the top of the second Z-elevator 123 so that it comes into contact with the carrier electrodes 144 at the bottom of the grounding port 143. Then, the poling assembly 121 polarizes (poles) the polymer film. Upon completion of poling, the second Z-elevator 123 lowers, and the workpiece 15 is transported by the second conveyor system 124 onto the transfer platform 13. Preferably, the poling chamber 12 includes a second sensor. This second sensor is used to detect the position of the carrier platform 14. When the carrier platform 14 reaches the preset second position, the second sensor signals the second conveyor system 124 to stop the carrier platform 14. The type of the second sensor is not limited; for example, it may be a position limit sensor.

The set-up of the second conveyor 124 may be consistent with that of the first conveyor system 112. For example, the second conveyor system 124 may include multiple rollers spaced apart, with gaps between rollers. The second conveyor system 124 may alternatively include a conveyor belt with gaps. The gaps allow the second Z-elevator 123 to pass through.

The second Z-elevator 123 includes second elevating rods (not marked) and a second motor (not shown). The second motor drives the second elevating rods up and down. There may be multiple second elevating rods. The number of second elevating rods matches the number of grounding ports 143 with corresponding positions. When the second elevating rods move up, they are inserted into the grounding ports 143, and as the second elevating rods move, they move the carrier platform 14 in a corresponding direction. The grounding wire 1231 passes through the second elevating rod and is exposed at the end close to the poling assembly 121, while the other end remains grounded. When the second elevating rod rises, the grounding wire 1231 electrically connects with the carrier electrodes 144.

The shape of the cover 122 is not limited. The cover 122 allows electrical connection between the grounding pads 1513 and the carrier electrodes 144. This allows the grounding electrodes 1512 of the workpiece 15 on the carrier platform 14 to be grounded through the grounding pads 1513, the conduction pad 1221, the carrier electrode 144, and the grounding wire 1231; hence, the lower surface of the polymer thin film is grounded. The cover 122 covers the grounding pads 1513 of the workpiece 15 and exposes the polymer thin film on the workpiece 15. Through the poling voltage provided evenly by the poling assembly 121, the polymer gets polarized.

The poling assembly 121 includes a mounting device as well as multiple poling modules. The mounting device and the poling modules may be dissembled and reassembled. Multiple poling modules may be used to polarize multiple regions of the workpiece 15. Damaged poling modules can easily be replaced, making it convenient for production assembly and maintenance. The positions of the multiple poling modules correspond to those of the grounding electrodes 1512, with each module polarizing a corresponding section of the polymer thin film. Preferably, the poling modules form an array and are aligned with the array of grounding electrodes 1512. Each poling module polarizes the piece/region of polymer thin film associated with the corresponding grounding electrode 1512. Rectangular format array is the preferred arrangement for the poling modules, preferably in the same plane. Each poling module includes high and low voltage terminals. The low voltage terminal is positioned between the high voltage terminal and the cover 122. The high voltage terminal is positioned between the mounting device and the low voltage terminal. The mounting device is further away from the cover 122 and the second Z-elevator 123, as compared to the poling module. The low voltage terminal is above the preset second position. The electric potential at the high voltage terminal is higher than that of the low voltage terminal. The high voltage terminal ionizes ionizable gas around it to form a plasma. The ionizable gas may be air, nitrogen, argon, or other ionizable gases. The low voltage terminal attracts the charges from the plasma and uniformly redistribute it to regions close to the surface of the polymer thin film to form a virtual electrode (a layer of charge cloud). Through this virtual electrode, a strong electric field forms and allows uniform polarization of the polymer thin film. It is understood that a poling module may include the high voltage terminal, low voltage terminal, and the ionizable gas. The high voltage terminal causes the ionization of the ionizable gas, while the low voltage terminal uniformly distributes the charges in the plasma.

The poling system 10 in this embodiment induces ionization of ionizable gas to form a plasma at the high voltage terminal. Concurrently, through the low voltage terminal, the charges in the plasma is uniformly distributes and are drawn towards the surface of the polymer thin film forming a virtual electrode (a layer of charge cloud) at the surface of said polymer thin film. It is through the strong electric field provided by this virtual electrode that uniform polarization of the polymer thin film is achieved. As compared to "direct poling" via the employment of a single high voltage source, this technology of "indirect poling" using high and low voltage terminals avoids electric breakdowns at thinner and pinhole regions of the polymer thin film. These breakdowns are seen in direct poling and can cause damage to the underlying microelectronic devices. In addition, indirect poling can uniformly polarize large areas of the polymer thin film surfaces and improve the production first pass yield as well as provide means for mass production. Furthermore, the resulting polarized polymer thin film has a stronger piezoelectric effect and a longer service life.

The electric potential at the high voltage terminal may be provided by an electric potential source. Preferably, arrayed needle electrodes or linear electrodes are employed at the high voltage terminal. The distance between the high and low voltage terminals is larger than that between the low voltage terminal and the carrier platform 14. It is understood that the distance between the low voltage terminal and the carrier platform 14 is the distance present when the carrier platform 14 is pushed up by the second Z-elevator 123.

Preferably, the low voltage terminal is a grid electrode or a plate electrode with through openings. The low voltage terminal determines the electric potential at the plane of the low voltage terminal; it also promotes uniform distribution of the electric field. There are through openings on the plate or grid electrode to allow the passage of ions. For example, a plate or grid electrode may be formed by parallel aligned metal wires. The gaps between the metal wires form the through openings. Preferably, the low voltage terminal is made of grid electrodes, and the preferred size of each grid is 1-100 mm$^2$. With a square grid, each side of the grid should be 1-10 mm.

Preferably, the gap between the low voltage terminal and the carrier platform 14 is 1-10 mm. By adjusting the gap distance between the low voltage terminal and the carrier platform 14, there is better control of the electric field inside the polymer membrane to achieve a strong and stable intra-membrane electric field. As mentioned earlier, the distance between the high and low voltage terminals is larger than that between the low voltage terminal and the carrier platform 14. Preferably, the distance between the high voltage terminal and the carrier platform 14 is 1-500 mm. Most preferred is a distance of 300 mm.

Preferably, the poling chamber 12 further includes a first electric potential controller to control the potential at the high voltage terminal. It is understood that the first electric potential controller is connected to a potential source. The control of the potential at the high voltage terminal is achieved via control of the potential source. Therefore, by controlling the potential source, the potential at the high voltage terminal can be adjusted during the poling process, or to be regulated for different polymer thin films.

Preferably, the poling apparatus further includes a second electric potential controller to control the potential at the low voltage terminal. This allows the potential at the low voltage terminal to be adjusted at any time during a poling process or to be adjusted to adapt to different polymer thin films. The potential difference between the high and low voltage terminals can be controlled via adjustments of the first and second electric potential controllers.

Preferably, the potential is 5-50 kV and 0.3-40 kV at the high and low voltage terminals, respectively. The stability of the poling process relies on the potentials at the high and low voltage terminals. It is noted here that the electric potential at the high voltage terminal has to be higher than that at the low voltage terminal. It is preferred that the potential at the high voltage terminal be 5-30 kV higher than the potential at the low voltage terminal. For example, if it is 40 kV at the high voltage terminal, the low voltage terminal may be 12 kV; if it is 30 kV at the high voltage terminal, the low voltage terminal may be 10 kV; if it is 20 kV at the high voltage terminal, the low voltage terminal may be 7 kV; if it is 15 kV at the high voltage terminal, the low voltage terminal may be 5 kV. In a preferred embodiment, the potentials are 20 kV and 7 kV at the high and low voltage terminals, respectively, which achieves good stability during poling and produces polarized thin films with good properties.

Preferably, in addition, the poling chamber 12 includes a current sensor to measure the current in the polymer thin film. Through the monitoring of the polymer thin film's current, the endpoint of poling can be determined. The current sensor may be electrically connected to the grounding wire 1231. The endpoint of poling may be determined by monitoring the real-time changes in the film current, such as the change in the slope. Preferably, a control processor (not shown in the figure), included in the polymer thin film poling device, can receive data from the current sensor. It is understood that such data collection between the current sensor and the control processor can occur through a wired data line or through wireless data transmissions such as Bluetooth or WiFi. The control processor can analyze the film current data, and accurately determine the poling endpoint based on changes in the slope of the current curve.

It is understood that the poling chamber 12 also includes an enclosure to provide the polymer workpiece 15 an isolated environment. This enclosure does not limit the scope of the embodiment of this application. This enclosure may be a box, a case, a barrow, or even a room. It is understood that the enclosure includes an entrance and an exit, allowing the entrance and exit of the carrier platform 14 and the workpiece 15. It is understood that the polarized workpiece is the workpiece 15 after the completing of polarization. Preferably, the connection between the cover 122 and the enclosure is elastic. When the second Z-elevator 123 pushes the carrier platform 14 up, there is no hard contact between the cover 122 and the enclosure. This prevents damages to the carrier platform and the cover 122. It is understood that to ensure accurate positioning of the carrier platform 14 as it is raised, a position sensor can be employed, or the number of rotations of the second motor can be controlled to limit the movement of the second elevating rod.

Figure 16:
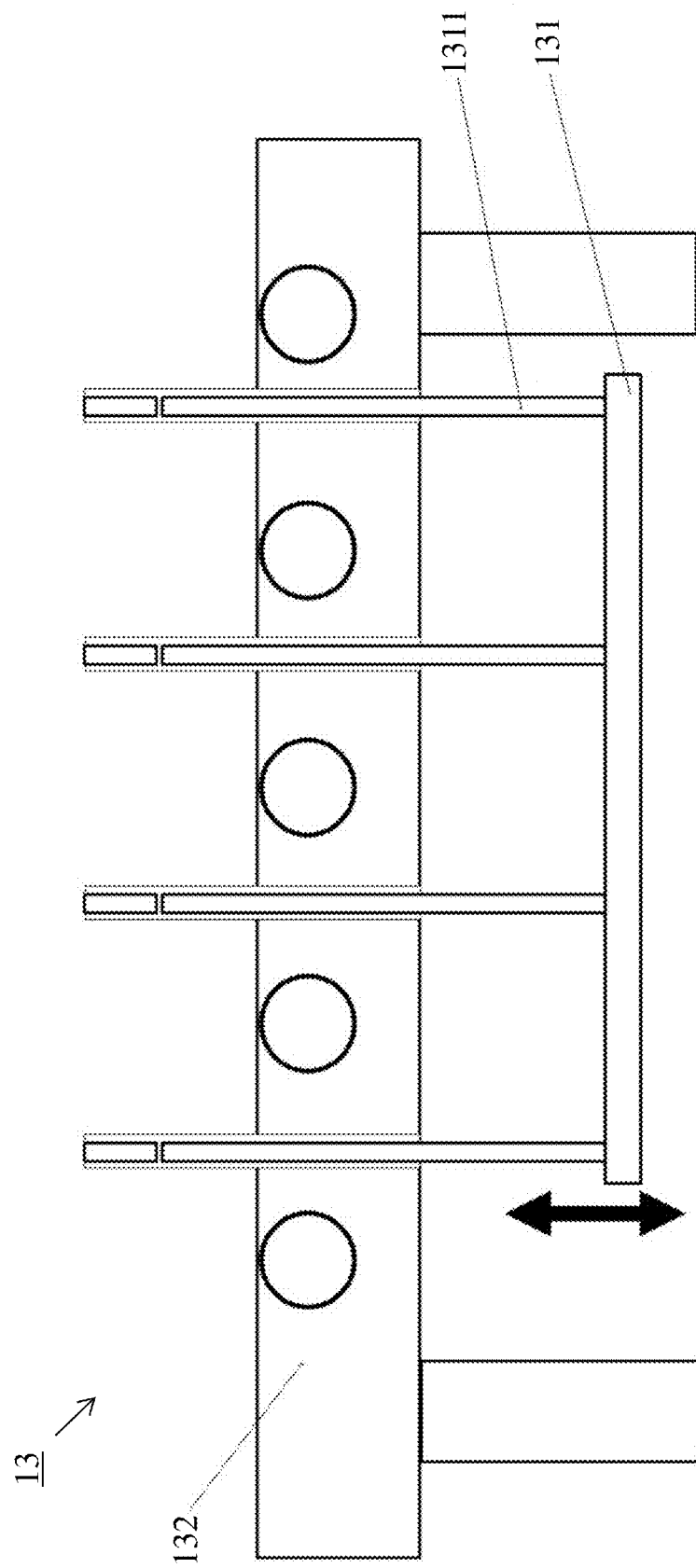
FIG. 16 is a schematic structural diagram of the transfer platform according to the embodiment of the present invention.

Referring to FIG. 16: The transfer platform 13 includes a third conveyor system 132 and a third Z-elevator 131. The third Z-elevator 131 is below the third conveyor system 132. The carrier platform 14 is moved to a preset third position by the third conveyor system 132. Then, the third Z-elevator 131 rises through the third conveyor system 132 and the jacking hole 142, allowing the carrier platform 14 to rise. A second external conveyor system then moves the polarized polymer workpiece 15 away. Preferably, the transfer platform 13 includes a third sensor. This third sensor is for sensing the position of the carrier platform 14. As the carrier platform reaches the third position, the third sensor signals the third conveyor system 132 to stop the movement of carrier platform 14. The type of the third sensor is not limited; it may be a position limit sensor.

The structure of the third conveyor system 132 may be similar to that of the first conveyor system 112. For example, the third conveyor system 132 may include multiple rollers spaced apart by gaps, or a conveyor belt with gaps, through which the second Z-elevator 123 may pass. After the second conveyor system 124 moves the carrier platform 14 partially onto the third conveyor system 132, the third conveyor system 132 moves the carrier platform 14 to a preset third position.

The third Z-elevator 132 includes the third elevating rod 1311 and a third motor (not shown in the figure). The third motor drives the third elevating rods 1311 up and down. There may be multiple third elevating rods 1311. The number and positions of the third elevating rods 1311 correspond to those of the jacking holes 142. As the third elevating rods 1311 moves up through the jacking holes 142 to elevate the polarized workpiece 15, the second external conveyor system moves the polarized workpiece 15 away.

To summarize, the poling system 10 of the embodiments of the present disclosure includes a preparation platform 11, poling chamber 12, transfer platform 13, and carrier platform 14. The poling chamber 12 is positioned between the preparation platform 11 and the transfer platform 13. The preparation platform 11 is used to stage the carrier platform 14 before its entry into the poling chamber 12. The carrier platform 14 carries the workpiece 15. The poling chamber 12 is where poling of the polymer thin film takes place. The transfer platform 13 is used to stage the polarized workpiece 15. Thus, an automated process of film poling is realized. The poling assembly 121 includes multiple poling components in array alignment, allowing the poling system 10 to polarize large pieces of a workpiece 15. The workpiece 15 is electrically grounded as it is raised by the second Z-elevator 123. The poling results are good, and the process is simple.

Figure 17:
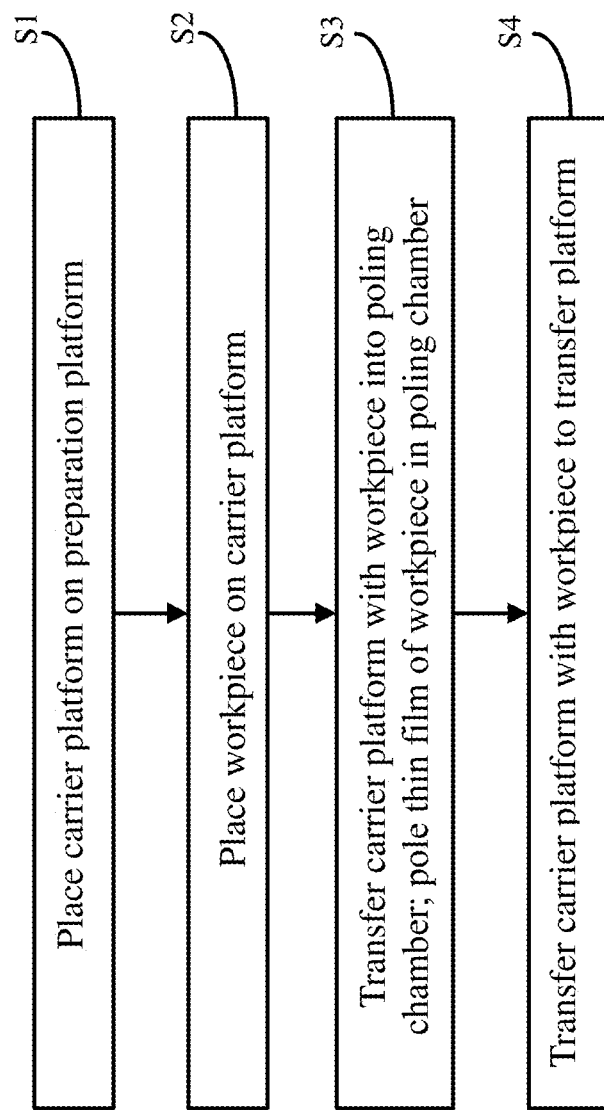
FIG. 17 is a schematic flowchart of the polarization method according to another embodiment of the present invention.

Referring to FIG. 17: The second embodiment of this application provides a poling method that is based on the first embodiment of this application. This poling method is used to polarize a polymer thin film. This poling method employs the poling system described in the first embodiment. The workpiece includes the substrate and the polymer thin film formed on the substrate. The poling system includes a preparation platform, poling chamber, transfer platform, and carrier platform. The poling method includes:

S1: Placing the carrier platform, ready for entry into the poling chamber, on the preparation platform;

S2: Placing the workpiece on the carrier platform;

S3: Polarizing the polymer thin film of the workpiece on the carrier platform in the poling chamber after the carrier platform enters the poling chamber; and S4: Placing the polarized workpiece on the transfer platform after the completion of polarization of the polymer thin film.

In S1 the carrier platform on the preparation platform does not carry the workpiece.

In S2, the workpiece is placed on the carrier platform after the carrier platform is moved to the preparation platform.

In S3, the poling chamber includes the poling assembly, second conveyor system, second Z-elevator, and cover. The cover includes the conductive pad. The second Z-elevator includes a grounding wire. The second Z-elevator is below the second conveyor system. The poling assembly is above the second conveyor system. The cover is between the second conveyor system and the poling assembly. The carrier platform is a plate. There is a substrate carrying recess on the carrier platform. There are grounding ports on the carrier platform surface that is opposite to the substrate carrying recess. The carrier platform includes carrier electrodes. At least some of the carrier electrodes are placed at the bottom of the grounding port and some on the sides of the substrate carrying recess. After the carrier platform enters the poling chamber, the poling of the polymer thin film of the workpiece on the carrier platform takes place, which includes:

The carrier platform and the workpiece enter the poling chamber and are positioned at the preset second position.

The second Z-elevator raises the carrier platform and the workpiece, allowing an electrical connection between the workpiece and the conductive pad of the cover, an electrical connection between the conductive pad of the cover and the carrier electrodes of the carrier platform, and an electrical connection between the carrier electrodes and the grounding wire of the second Z-elevator.

The poling assembly polarizes the polymer thin film on the workpiece.

In S4, after poling is completed, the workpiece and the carrier platform are moved to the transfer platform. Then, the polarized workpiece is removed from the carrier platform.

Embodiments of the present disclosure provide a poling method, in which the poling system includes a preparation platform, poling chamber, transfer platform, and carrier platform. The poling chamber is located between the preparation platform and the transfer platform. The preparation platform is used to stage the carrier platform before its entry into the poling chamber. The carrier platform carries the workpiece, and the poling chamber poles the polymer thin film. The transfer platform is used to place the polarized polymer workpiece. Thus an automated process of film poling is achieved. The poling assembly includes multiple poling modules in array alignment, allowing the poling system to polarize large pieces of a workpiece. The workpiece is grounded as it is raised by the second Z-elevator. The poling results are good, and the process is simple.

Compared to existing technology, the embodiments of this disclosure allow polarized polymer thin films to be cut into smaller polarized films, increasing the production efficiency of small size polarized polymer thin films. Such poling is achieved through a method and setup that comprises of a workpiece, carrier platform, and poling chamber. The workpiece includes a substrate and the polymer thin film formed on this substrate. The substrate includes a base plate, grounding electrodes, and grounding pads. The grounding pads are aligned in an array at the edge of the base plate; there are multiple grounding electrodes. The grounding pads and the grounding electrodes are on the same surface of the base plate. The polymer thin film covers the grounding electrodes while leaving the grounding pads exposed.

What has been described and illustrated herein is a preferred embodiment of the disclosure along with the explanation of the principle of the technology used. It is to be understood that the embodiment in this disclosure is not limited to the technical solutions of the specific combination of the technical features described herein. The disclosure is capable of other embodiments that utilize equivalent technical features in varying combinations and of being practiced and carried out in various ways. For example, the technical solutions formed through adjustment and substitution of the techniques with similar features of the techniques disclosed (not limited to) in this disclosure.

Note that the embodiments presented herein are only preferred embodiments of the inventions and the applied technical principles. Those skilled in the art will understand that the present invention is not limited to the specific embodiments described herein, and those skilled in the art can make various noticeable changes, adjustments, and substitutions without departing from the scope of the invention. Although an exemplary embodiment described the invention in detail, it does not limit the invention, and there may be other additional embodiments within the scope of the invention, as defined by the appended claims.

What is claimed is:

1. A poling apparatus for poling a polymer thin film formed on a work piece, the work piece being disposed on a workpiece carrier, the poling apparatus comprising:
    a poling source configured to generate a plasma:
    a Z-elevator disposed below the poling source and configured to move the workpiece carrier in a vertical direction, the Z-elevator including a conductive grounding cable which has a portion that is exposed at a top of the Z-elevator;
    a grounding mechanism including:
        one or more resilient dampers;
        one or more covers each mechanically connected to one or more of the resilient dampers to move in a vertical direction and biased downwardly by the resilient dampers, wherein the one or more covers are disposed around a center area located below the poling source and above the Z-elevator; and
        one or more electrical contact pads mounted on each cover, the electrical contact pads being disposed above the Z-elevator and facing downwardly; and
    an enclosure configured to enclose the poling source, the Z-elevator and the grounding mechanism.

2. The poling apparatus of claim 1, wherein the poling source includes:
    a plasma source configured to generate a plasma by ionizing a processing gas; and
    a grid electrode disposed below the plasma source, the grid electrode having through openings configured to pass charged particles of the plasma.

3. The poling apparatus of claim 1, wherein each contact pad is a foam pad.

4. The poling apparatus of claim 1, wherein the enclosure includes a liftable top, and wherein the poling source is mounted on the liftable top.

5. The poling apparatus of claim 1, further comprising an X-Y scanning stage affixed to the enclosure, wherein the poling source is mounted on the X-Y scanning stage, and wherein the X-Y scanning stage is configured to move the poling source in a horizontal direction.

6. The poling apparatus of claim 1, further comprising a plurality of rollers spaced apart from each other with gaps in between, wherein the Z-elevator includes a plurality of elevating rods configured to move in a vertical direction passing through the gaps, and wherein the portion of the conductive grounding cable is exposed at a top of one of the elevating rods.

7. The poling apparatus of claim 1, further comprising the workpiece carrier, which includes:
    a platform having a first surface and a second surface opposite to each other, the first surface defining a recess configured to carry the workpiece, the second surface defining a plurality of grounding ports; and
    an electrode formed on the platform, including a plurality of first electrode portions exposed in a peripheral area of the first surface of the platform around the recess, and at least one second electrode portion disposed on a bottom of at least one of the grounding ports, wherein the plurality of first electrode portions and the at least one second electrode portion are electrically connected to each other.

8. The poling apparatus of claim 7, wherein the Z-elevator is configured to be inserted into the grounding ports of the workpiece carrier, and wherein the exposed portion of the conductive grounding cable of the Z-elevator is configured to electrically contact the second electrode portion of the workpiece carrier that is disposed on the bottom of the at least one of the grounding ports.

9. The poling apparatus of claim 8, further comprising the workpiece disposed in the recess of the workpiece carrier, the workpiece including:
    a base plate;
    an electrode layer formed on a surface of the base place, including one or more grounding electrodes and one or more grounding pads, the grounding pads being located at edges of the base plate, each grounding electrode being electrically connected to at least one of the grounding pads; and
    a polymer thin film formed on the base plate over a portion of the electrode layer, the polymer thin film leaving each grounding pad at least partly uncovered.

10. The poling apparatus of claim 9, wherein the polymer thin film is exposed to the center area defined by the covers of the grounding mechanism, and wherein when the Z-elevator moves the workpiece carrier to a predefined vertical position, each electrical contact pad of the grounding mechanism is configured to electrically contact both one or more of the grounding pads of the workpiece and one or more of the first electrode portions of the workpiece carrier.

11. The poling apparatus of claim 9,
    wherein the one or more grounding electrodes include a plurality of grounding electrodes forming an array; and
    wherein the poling source includes a plurality of poling modules forming an array, each poling modules being located above a grounding electrode of the workpiece.

12. A poling system comprising the poling apparatus of claim 1, further comprising:
    a preparation platform disposed adjacent the enclosure of the poling apparatus, including:
        a plurality of first rollers spaced apart from each other with first gaps in between; and
        a first Z-elevator having a plurality of first elevating rods configured to move in a vertical direction passing through the first gaps; and
    a transfer platform disposed adjacent the enclosure of the poling apparatus, including:
        a plurality of third rollers spaced apart from each other with third gaps in between; and
        a third Z-elevator having a plurality of third elevating rods configured to move in a vertical direction passing through the third gaps;
    wherein the poling apparatus further includes a plurality of second rollers spaced apart from each other with second gaps in between, wherein the Z-elevator of the poling apparatus includes a plurality of second elevating rods configured to move in a vertical direction passing through the second gaps; and
    wherein the plurality of first rollers are configured to convey the workpiece carrier from the preparation platform to the poling apparatus, and the plurality of second rollers are configured to convey the workpiece carrier from the poling apparatus to the transfer platform.

13. The poling system of claim 12, further comprising the workpiece carrier, which includes:
    a platform having a first surface and a second surface opposite to each other, the first surface defining a recess configured to carry the workpiece, the second surface defining a plurality of grounding ports, the platform further defining a plurality of through holes extending between the first and second surfaces; and an electrode formed on the platform, including a plurality of first electrode portions exposed in a peripheral area of the first surface of the platform around the recess, and at least one second electrode portion disposed on a bottom of at least one of the grounding ports, wherein the plurality of first electrode portions and the at least one second electrode portion are electrically connected to each other;

wherein the plurality of first elevating rods of the first Z-elevator are configured to pass through the plurality of through holes of the workpiece carrier, wherein the plurality of second elevating rods of the Z-elevator of the poling apparatus are configured to be inserted into the grounding ports of the workpiece carrier, and wherein the exposed portion of the conductive grounding cable of the Z-elevator is configured to electrically contact the second electrode portion of the workpiece carrier that is disposed on the bottom of the at least one of the grounding ports, and wherein the third elevating rods of the third Z-elevator are configured to pass through the plurality of through holes of the workpiece carrier.

* * * * *